US012656644B2

(12) United States Patent
Oh et al.

(10) Patent No.: US 12,656,644 B2
(45) Date of Patent: Jun. 16, 2026

(54) DISPLAY DEVICE

(71) Applicant: Samsung Display Co., Ltd., Yongin-Si (KR)

(72) Inventors: Myong Soo Oh, Asan-si (KR); Hee Jong Shin, Seoul (KR); Hyun Chul Jin, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 84 days.

(21) Appl. No.: 17/553,560

(22) Filed: Dec. 16, 2021

(65) Prior Publication Data

US 2022/0197069 A1 Jun. 23, 2022

(30) Foreign Application Priority Data

Dec. 18, 2020 (KR) ........................ 10-2020-0178300

(51) Int. Cl.
G02F 1/1345 (2006.01)
G02F 1/1362 (2006.01)
H05K 1/02 (2006.01)

(52) U.S. Cl.
CPC ........ G02F 1/1345 (2013.01); G02F 1/13452 (2013.01); G02F 1/13458 (2013.01); G02F 1/13454 (2013.01); G02F 1/136286 (2013.01); H05K 1/0269 (2013.01); H05K 1/0298 (2013.01)

(58) Field of Classification Search
None
See application file for complete search history.

(56) References Cited

U.S. PATENT DOCUMENTS

| 7,403,257 B2* | 7/2008 | Shin ...................... G02F 1/1309 |
| | | 349/149 |
| 8,216,937 B2* | 7/2012 | Chang ................. H01L 27/1288 |
| | | 257/E21.211 |
| 10,303,014 B2 | 5/2019 | Oh |
| 2007/0090403 A1* | 4/2007 | Ahn .................... G02F 1/13458 |
| | | 257/E27.111 |

(Continued)

FOREIGN PATENT DOCUMENTS

| JP | 2013-242517 A1 | 12/2013 |
| KR | 10-2007-0043098 A | 4/2007 |
| KR | 10-2008-0046021 A1 | 5/2008 |

(Continued)

*Primary Examiner* — Dung T Nguyen
(74) *Attorney, Agent, or Firm* — Innovation Counsel LLP

(57) ABSTRACT

The display device comprises a first base portion including display and non-display areas and a pad area, and a printed circuit film attached to the pad area of the first base portion, wherein pad electrodes on the first base portion and a first panel alignment mark on one side of the plurality of pad electrodes are disposed in the pad area, a first protective layer is on the pad electrodes, and a first open portion that exposes a portion of an upper surface of each pad electrode is defined in the protective layer, the printed circuit film includes a third base portion and lead electrodes on a lower surface of the third base portion and connected to the pad electrodes, and the first panel alignment mark includes a first panel alignment metal portion and a second open portion and surrounded by the first panel alignment metal portion on a plane.

20 Claims, 22 Drawing Sheets

(56)            References Cited

U.S. PATENT DOCUMENTS

2018/0076235 A1 * 3/2018 Kim ................... G02F 1/13452
2020/0355972 A1 * 11/2020 Jian .................... G02F 1/13452

FOREIGN PATENT DOCUMENTS

KR      10-2017-0139214 A      12/2017
KR      10-2018-0003724 A1      1/2018
KR      10-2020-0037910 A1      4/2020

* cited by examiner

EL: AE, ED, CE

DISPLAY DEVICE

CROSS-REFERENCE TO RELATED APPLICATION

This application claims priority from Korean Patent Application No. 10-2020-0178300 Filed on Dec. 18, 2020 in the Korean Intellectual Property Office, the disclosure of which is incorporated herein by reference in its entirety.

BACKGROUND

1. Field

The present disclosure relates to a display device. More particularly, the present disclosure relates to a display device capable of reducing an alignment tolerance between pad electrodes and lead electrodes.

2. Description of the Related Art

With the advancement of the information society, requirements for a display device for displaying an image are increasing in various forms. For example, the display device is applied to various electronic devices such as a smart phone, a digital camera, a laptop, a navigation device, and a smart TV. The display device may be a flat panel display device such as a liquid crystal display device, a field emission display device, or an organic light-emitting display device.

Meanwhile, in order to drive a screen of the display device, a data voltage and/or a scan signal from an external device is applied, and as the resolution of the display device increases, the number of input pad electrodes to receive the data voltage and/or the scan signal from the external device should be increased.

These input pad electrodes are electrically connected to the external device, for example, lead electrodes of a printed circuit film, and in order to prevent screen driving failures of the display device, alignment between the input pad electrodes and the corresponding lead electrodes, of which a large number are required at a high resolution, is important.

SUMMARY

An aspect of the present disclosure provides a display device capable of reducing an alignment tolerance between pad electrodes and lead electrodes.

Aspects of the present disclosure are not limited to the aspects mentioned above, and other technical aspects not mentioned above will be clearly understood by those skilled in the art from the following description.

According to an embodiment, a display device comprises a first base portion including a display area having a plurality of pixels and a non-display area positioned around the display area and having a pad area; and a printed circuit film attached to the pad area of the first base portion, wherein a plurality of pad electrodes arranged on the first base portion in a first direction and a first panel alignment mark positioned on one side of the plurality of pad electrodes in the first direction are disposed in the pad area, a first protective layer is disposed on the pad electrodes, a first open portion that exposes a portion of an upper surface of each pad electrode is defined in the first protective layer, the printed circuit film includes a third base portion and a plurality of lead electrodes disposed on a lower surface of the third base portion and electrically connected to the plurality of pad electrodes, respectively, and the first panel alignment mark includes a first panel alignment metal portion and a second open portion penetrating the first panel alignment metal portion in a thickness direction and surrounded by the first panel alignment metal portion on a plane.

According to another embodiment, a display device comprises a first base portion including a display area including a plurality of pixels and a non-display area positioned around the display area and having a pad area; and a printed circuit film attached to the pad area of the first base portion, wherein a plurality of pad electrodes arranged on the first base portion in a first direction and a first panel alignment mark positioned on one side of the plurality of pad electrodes in the first direction are disposed in the pad area, a first protective layer is disposed on the pad electrodes, and a first open portion that exposes a portion of an upper surface of each pad electrode is defined in the first protective layer, the printed circuit film includes a third base portion and a plurality of lead electrodes disposed on a lower surface of the third base portion and electrically connected to the plurality of pad electrodes, respectively, the first panel alignment mark includes a first panel alignment metal portion, a first panel alignment insulating portion disposed on the first panel alignment metal portion and positioned on a same layer as the first protective layer, and a second open portion penetrating the first panel alignment metal portion in a thickness direction and surrounded by the first panel alignment metal portion on a plane, the first panel alignment mark and the pad electrode are positioned on a same layer, and the first panel alignment insulating portion is spaced apart from the first protective layer.

Specific details of other example embodiments are included in the detailed description and drawings.

DETAILED DESCRIPTION

Figure 1:
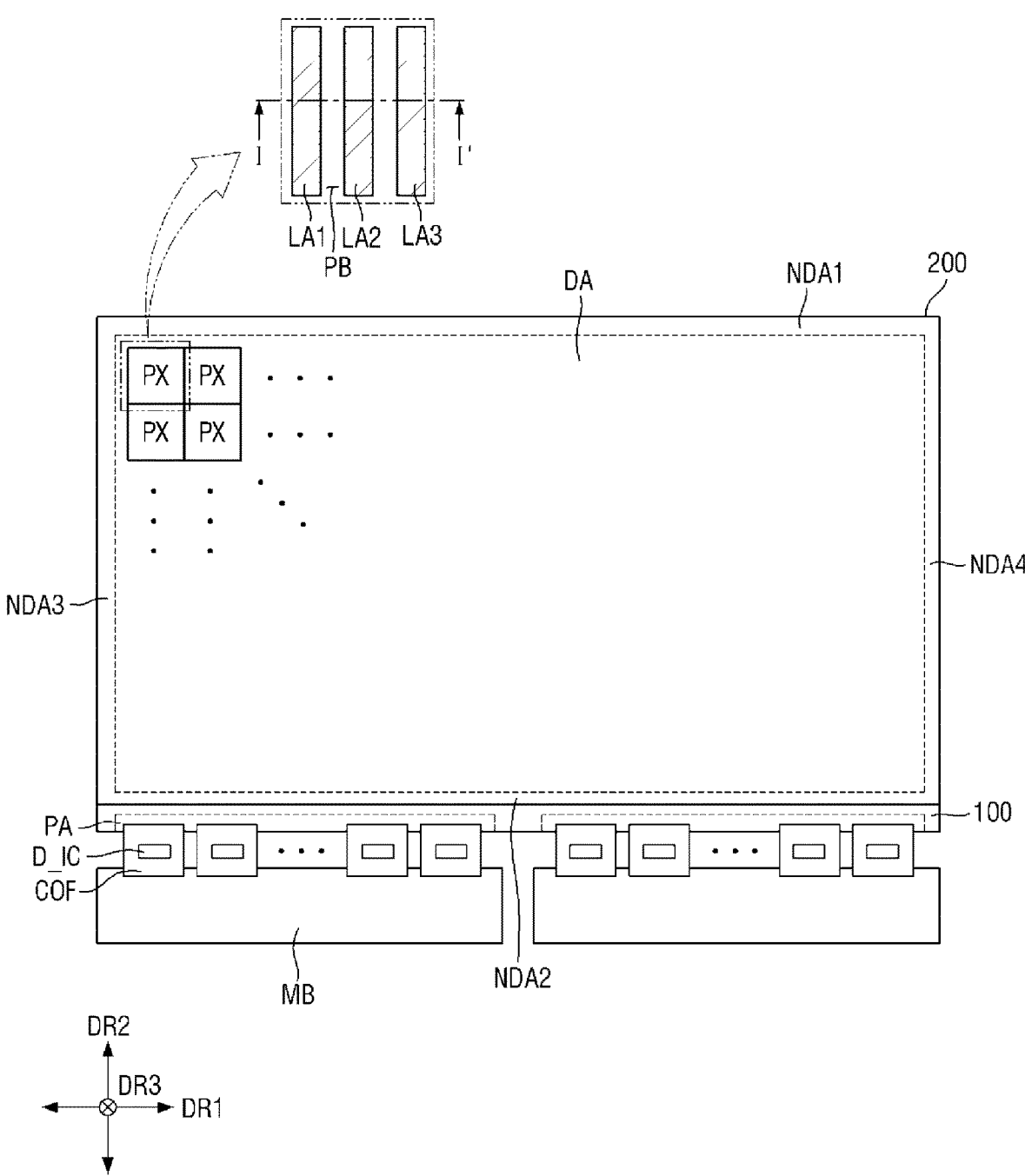
FIG. 1 is a plan view showing a display device according to an example embodiment.

Specific structural and functional descriptions of embodiments of the present disclosure disclosed herein are only for illustrative purposes of the embodiments of the present disclosure. The present disclosure may be embodied in many different forms without departing from the spirit and significant characteristics of the present disclosure. Therefore, the embodiments of the present disclosure are disclosed only for illustrative purposes and should not be construed as limiting the present disclosure. That is, the present disclosure is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The example term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the attached drawings.

Figure 2:
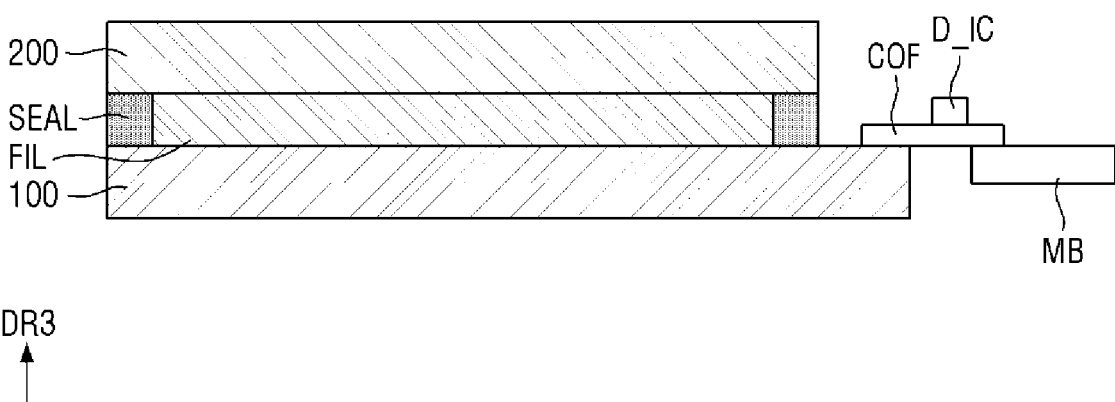
FIG. 2 is a schematic cross-sectional view of the display device according to FIG. 1.

FIG. 1 is a plan view showing a display device according to an example embodiment. FIG. 2 is a schematic cross-sectional view of the display device according to FIG. 1. FIG. 2 shows a cross-sectional view cut in a second direction DR2 of the plan view of the display device of FIG. 1.

Referring to FIGS. 1 and 2, a display device displays a moving image or a still image. The display device may refer to any electronic device that provides a display screen. For example, a television, a laptop, a monitor, a billboard, an Internet of Things device, a mobile phone, a smart phone, a tablet PC (personal computer), an electronic watch, a smart watch, a watch phone, a head-mounted display, a mobile communication terminal, an electronic notebook, an e-book reader, a portable multimedia player (PMP), a navigation device, a game console, a digital camera, a camcorder, and the like that provide display screens may be included in the display device.

The display device includes a display panel that provides a display screen. Examples of the display panel may include a light-emitting diode (LED) display panel, an organic light-emitting display panel, a quantum dot light-emitting display panel, a plasma display panel, and a field emission display panel. Hereinafter, a case in which the LED display panel is applied as an example of the display panel is illustrated, but the present disclosure is not limited thereto, and when the same technical spirit is applicable, it may also be applied to other display panels.

A shape of the display device may be variously modified. For example, the display device may have a shape such as a horizontally long rectangle, a vertically long rectangle, a square, a quadrangle having rounded corners (vertices), other polygons, or a circle. A shape of a display area DA of the display device may also be similar to the overall shape of the display device. FIG. 1 illustrates a display device and a display area DA having a horizontally long rectangular shape.

The display device may include the display area DA and a non-display area NDA. The display area DA includes a plurality of pixels PX and is an area in which an image may be displayed, and the non-display area NDA is an area in which the image may not be displayed. The display area DA may be referred to as an active area and the non-display area NDA may also be referred to as an inactive area. The display area DA may generally occupy a center of the display device.

The display area DA may include the plurality of pixels PX. The plurality of pixels PX may be arranged in a matrix direction. A shape of each pixel PX may be rectangular or square on a plane, but the present disclosure is not limited thereto, and may also be a rhombic shape in which each side is inclined with respect to one direction. Each pixel PX may be alternately arranged in a stripe type or pen tile type. In addition, each of the pixels PX may include at least one light emitting element that emits light in a specific wavelength band to display a specific color.

The non-display area NDA may be disposed around display area DA. The non-display area NDA may completely or partially surround the display area DA. The display area DA has a rectangular shape, and the non-display area NDA may be disposed to be adjacent to four sides of the display area DA. The non-display area NDA may form a bezel of the display device. As shown in FIG. 1, the non-display area NDA disposed to be adjacent to the four sides of the display area DA may include a first non-display area NDA1 disposed to be adjacent to a first side of the display area DA (one side in the second direction DR2), a second non-display area NDA2 disposed to be adjacent to a second side of the display area DA (the other side in the second direction DR2), a third non-display area NDA3 disposed to be adjacent to a third side of the display area DA (the other side in a first direction DR1), and a fourth non-display area NDA4 disposed to be adjacent to a fourth side of the display area DA (one side in the first direction DR1).

The fourth non-display area NDA4 positioned on the other side in the second direction DR2 of the display area DA may include a pad area PA. A printed circuit film COF may be attached to the pad area PA. A plurality of printed circuit films COF are provided, and the plurality of printed circuit films COF may be arranged along the first direction DR1. A driving member D_IC may be mounted on each printed circuit film COF. For example, as shown in FIG. 1, the driving member may be provided in a form of a driving chip.

One end of the printed circuit film COF may be attached to the pad area PA, and a main circuit board MB may be attached to the other end thereof. The main circuit board MB may be attached to the plurality of printed circuit films COF. FIG. 1 illustrates a case in which each of two main circuit boards MBs is attached to the plurality of printed circuit films COF.

Referring to an enlarged view of FIG. 1, each of the pixels PX of the display device may include light-emitting areas LA1, LA2, and LA3 defined by a pixel defining film, and light having a predetermined peak wavelength may be emitted through the light-emitting areas LA1, LA2, and LA3. For example, the display area DA of the display device may include first, second, and third light-emitting areas LA1, LA2, and LA3. Each of the first, second, and third light-emitting areas LA1, LA2, and LA3 may be an area in which light generated by a light-emitting element of the display device is emitted to the outside of the display device.

The first, second, and third light-emitting areas LA1, LA2, and LA3 may emit light having a predetermined peak wavelength to the outside of the display device. The first light-emitting area LA1 may emit light of a first color, the second light-emitting area LA2 may emit light of a second color, and the third light-emitting area LA3 may emit light of a third color. For example, the light of the first color may be red light having a peak wavelength in a range of about 610 nm to about 650 nm, the light of the second color may be green light having a peak wavelength in a range of about 510 nm to about 550 nm, and the light of the third color may be blue light having a peak wavelength in a range of about 440 nm to about 480 nm, but the present disclosure is not limited thereto.

The display area DA of the display device may include a light blocking area positioned between adjacent light-emitting areas LA1, LA2, and LA3. For example, the light blocking area positioned between the light-emitting areas may surround the first, second, and third light-emitting areas LA1, LA2, and LA3.

The display device may include a first substrate 100 and a second substrate 200 disposed on the first substrate 100. A planar size of the first substrate 100 may be larger than a planar size of the second substrate 200. For example, the first substrate 100 may further protrude from the other long side in the second direction DR2 extending along the first direction DR1 of the second substrate 200 to the other side in the second direction DR2. The remaining sides of the first substrate 100 may be aligned with the remaining sides of the second substrate 200. The plurality of printed circuit films COF may be adhered to a portion that protrudes from the second substrate 200 of the first base portion SUB1.

A filling layer FIL may be disposed between the first substrate 100 and the second substrate 200. In addition, a sealing member SEAL that couples the first substrate 100 and the second substrate 200 may be disposed in the non-display areas NDAs (NDA1, NDA2, NDA3, and NDA4) of FIG. 1. The sealing member SEAL may surround the filling layer FIL on a plane.

Figure 3:
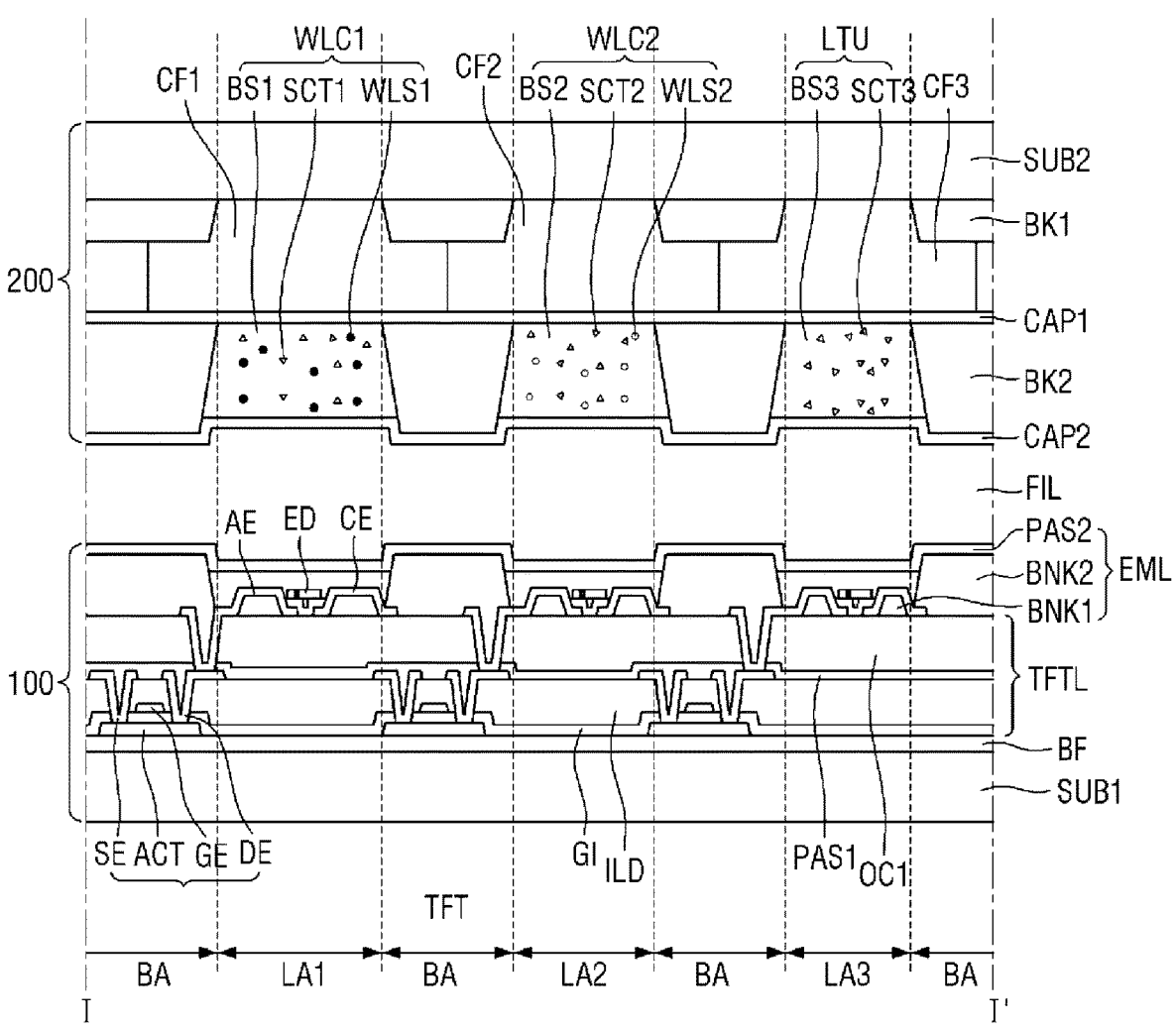
FIG. 3 is a cross-sectional view taken along line I-I' of an enlarged view of FIG. 1.

FIG. 3 is a cross-sectional view taken along line I-I' of an enlarged view of FIG. 1.

Referring to FIG. 3, a first substrate 100 of the display device may include a first base portion SUB1, a buffer layer BF, a thin film transistor layer TFTL, and a light-emitting element layer EML.

The first base portion SUB1 may be a base substrate or a base member, and may be made of an insulating material such as a polymer resin. For example, the first base portion SUB1 may be a rigid substrate.

The buffer layer BF may be disposed on the first base portion SUB1. The buffer layer BF may be made of an inorganic film capable of preventing the penetration of air or moisture.

The thin film transistor layer TFTL may include a thin film transistor TFT, a gate insulating film GI, an interlayer insulating film ILD, a first protective layer PAS1, and a first planarization layer OC1.

The thin film transistor TFT may be disposed on the buffer layer BF, and may constitute a pixel circuit of each of the plurality of pixels.

A semiconductor layer ACT may be provided on the buffer layer BF. The semiconductor layer ACT may overlap a gate electrode GE, a source electrode SE, and a drain electrode DE. The semiconductor layer ACT may be in direct contact with the source electrode SE and the drain electrode DE, and may face the gate electrode GE with the gate insulating film GI therebetween.

The gate electrode GE may be disposed on the gate insulating film GI. The gate electrode GE may overlap the semiconductor layer ACT with the gate insulating film GI therebetween.

The source electrode SE and the drain electrode DE may be disposed to be spaced apart from each other on the interlayer insulating film ILD. The source electrode SE may be in direct contact with one end of the semiconductor layer ACT through a contact hole provided in the gate insulating film GI and the interlayer insulating film ILD. The drain electrode DE may be in direct contact with the other end of the semiconductor layer ACT through a contact hole pro-vided in the gate insulating film GI and the interlayer insulating film ILD. The drain electrode DE may be in direct contact with a first electrode AE of a light-emitting member EL through a contact hole provided in the first protective layer PAS1 and the first planarization layer OC1.

The gate insulating film GI may be provided on the semiconductor layer ACT. For example, the gate insulating film GI may be disposed on the semiconductor layer ACT and the buffer layer BF, and may insulate the semiconductor layer ACT and the gate electrode GE. The gate insulating film GI may include a contact hole through which the source electrode SE passes and a contact hole through which the drain electrode DE passes.

The interlayer insulating film ILD may be disposed on the gate electrode GE. For example, the interlayer insulating film ILD may include the contact hole through which the source electrode SE passes and the contact hole through which the drain electrode DE passes.

The first protective layer PAS1 may be provided on the thin film transistor TFT to protect the thin film transistor TFT. For example, the first protective layer PAS1 may include a contact hole through which the first electrode AE passes.

The first planarization layer OC1 may be provided on the first protective layer PAS1 to planarize an upper end of the thin film transistor TFT. For example, the first planarization layer OC1 may include the contact hole through which the first electrode AE of the light-emitting member EL passes.

The light-emitting element layer EML may include the light-emitting member EL, a first lower bank BNK1, a second lower bank BNK2, and a second protective layer PAS2.

The light-emitting member EL may be provided on the thin film transistor TFT. The light-emitting member EL may include the first electrode AE, a second electrode CE, and a light-emitting element ED.

The first electrode AE may be provided on the first planarization layer OC1. For example, the first electrode AE may be disposed on the first lower bank BNK1 disposed on the first planarization layer OC1 to cover the first lower bank BNK1. The first electrode AE may be disposed to overlap one of the first, second, and third light-emitting areas LA1, LA2, and LA3 defined by the second lower bank BNK2. In addition, the first electrode AE may be connected to the drain electrode DE of the thin film transistor TFT.

The second electrode CE may be provided on the first planarization layer OC1. For example, the second electrode CE may be disposed on the first lower bank BNK1 disposed on the first planarization layer OC1 to cover the first lower bank BNK1. The second electrode CE may be disposed to overlap one of the first, second, and third light-emitting areas LA1, LA2, and LA3 defined by the second lower bank BNK2. For example, the second electrode CE may receive a common voltage supplied to all pixels.

A first insulating layer IL1 may cover a portion of the first electrode AE and a portion of the second electrode CE adjacent to each other, and may insulate the first electrode AE and the second electrode CE.

The light-emitting element ED may be disposed between the first electrode AE and the second electrode CE on the first planarization layer OC1. The light-emitting element ED may be disposed on the first insulating layer ILE One end of the light-emitting element ED may be connected to the first electrode AE, and the other end of the light-emitting element ED may be connected to the second electrode CE. For example, a plurality of light-emitting elements ED may include an active layer having the same material to emit light of the same wavelength band or light of the same color. Light emitted from each of the first to third light-emitting areas LA1, LA2, and LA3 may have the same color. For example, the plurality of light-emitting elements ED may emit light of a third color or blue light having a peak wavelength in the range of about 440 nm to about 480 nm.

The second lower bank BNK2 may be disposed on the first planarization layer OC1 to define the first, second, and third light-emitting areas LA1, LA2, and LA3. For example, the second lower bank BNK2 may surround each of the first, second, and third light-emitting areas LA1, LA2, and LA3, but the present disclosure is not limited thereto. The second lower bank BNK2 may be disposed in a light blocking area BA.

The second protective layer PAS2 may be disposed on a plurality of light-emitting members EL and the second lower bank BNK2. The second protective layer PAS2 may cover the plurality of light-emitting members EL and may protect the plurality of light-emitting members EL.

The second substrate 200 of the display device may include a second base portion SUB2, a plurality of upper banks BK1 and BK2, first, second, and third color filters CF1, CF2, and CF3, a plurality of capping layers CAP1 and CAP2, first and second wavelength conversion units WLC1 and WLC2, and a light transmitting unit LTU.

In more detail, the second base portion SUB2 faces the first base portion SUB1. The second base portion SUB2 may include the same material as the exemplified material of the first base portion SUB1.

A first upper bank BK1 may be disposed on one surface of the second base portion SUB2 facing the first base portion SUB1. The first upper bank BK1 may be disposed in the light blocking area BA.

The first, second, and third color filters CF1, CF2, and CF3 may be disposed on the first upper bank BK1 and one surface of the second base portion SUB2 facing the first base portion SUB1. The first color filter CF1 may be disposed in the first light-emitting area LA1, the second color filter CF2 may be disposed in the second light-emitting area LA2, and the third color filter CF3 may be disposed in the third light-emitting area LA3.

The first color filter CF1 may overlap the first wavelength conversion unit WLC1 in a thickness direction. The first color filter CF1 may selectively transmit light of a first color (e.g., red light), and may block or absorb light of a second color (e.g., green light) and light of a third color (e.g., blue light).

The second color filter CF2 may overlap the second wavelength conversion unit WLC2 in the thickness direction. The second color filter CF2 may selectively transmit the light of the second color (e.g., green light) and may block or absorb the light of the first color (e.g., red light) and the light of the third color (e.g., blue light).

The third color filter CF3 may overlap the light transmitting unit LTU in the thickness direction. The third color filter CF3 may selectively transmit the light of the third color (e.g., blue light), and may block or absorb the light of the first color (e.g., red light) and the light of the second color (e.g., green light).

The first, second, and third color filters CH, CF2, and CF3 may absorb a part of light introduced from the outside of the display device to reduce reflected light due to external light. Therefore, the first, second, and third color filters CH, CF2, and CF3 may prevent color distortion due to reflection of the external light.

A first capping layer CAP1 may be disposed on the first, second, and third color filters CH, CF2, and CF3. The first capping layer CAP1 may contain an inorganic material. The first capping layer CAP1 may seal lower surfaces of the first and second wavelength conversion units WLC1 and WLC2 and the light transmitting unit LTU.

A second upper bank BK2 may be disposed on the first capping layer CAP1. The second upper bank BK2 may be disposed in the light blocking area BA. The first and second wavelength conversion units WLC1 and WLC2 and the light transmitting unit LTU may be disposed between adjacent second upper banks BK2. A second capping layer CAP2 may be disposed on the first and second wavelength conversion units WLC1 and WLC2, the light transmitting unit LTU, and the second upper bank BK2. The second capping layer CAP2 may include an inorganic material, and may seal the lower surfaces of the first and second wavelength conversion units WLC1 and WLC2, the light transmitting unit LTU, and the second upper bank BK2.

The first wavelength conversion unit WLC1 may be disposed in the first light-emitting area LA1 on the first capping layer CAP1. The first wavelength conversion unit WLC1 may be surrounded by the first upper bank BK1. The first wavelength conversion unit WLC1 may include a first base resin BS1, a first scatterer SCT1, and a first wavelength shifter WLS1.

The first base resin BS1 may include a material having relatively high light transmittance. The first base resin BS1 may be made of a transparent organic material. For example, the first base resin BS1 may include at least one of organic materials such as an epoxy resin, an acrylic resin, a cardo resin, and an imide resin.

The first scatterer SCT1 may have a refractive index different from that of the first base resin BS1, and may form an optical interface with the first base resin BS1.

The first wavelength shifter WLS1 may convert or shift a peak wavelength of incident light to a first peak wavelength. For example, the first wavelength shifter WLS1 may convert blue light provided from the display device into red light having a single peak wavelength in the range of about 610 nm to about 650 nm to emit the converted light. The first wavelength shifter WLS1 may be a quantum dot, a quantum rod, or a phosphor. The quantum dot may be particulate matter that emits a specific color while electrons transition from a conduction band to a valence band.

The light emitted by the first wavelength shifter WLS1 may have a full width at half maximum (FWHM) of an emission wavelength spectrum of about 45 nm or less, about 40 nm or less, or about 30 nm or less, and the color purity and color reproducibility of a color displayed by the display device may be further improved.

A part of blue light provided from the light-emitting element layer EML may pass through the first wavelength conversion unit WLC1 without being converted into red light by the first wavelength shifter WLS1. Among the blue light provided from the light-emitting element layer EML, light incident on the first color filter CF1 without being converted by the first wavelength conversion unit WLC1 may be blocked by the first color filter CF1. In addition, the red light converted by the first wavelength conversion unit WLC1 among the blue light provided from the display device may pass through the first color filter CF1 to be emitted to the outside. Therefore, the first light-emitting area LA1 may emit the red light.

The second wavelength conversion unit WLC2 may be disposed in the second light-emitting area LA2 on the first capping layer CAP1. The second wavelength conversion unit WLC2 may be surrounded by the first upper bank BK1. The second wavelength conversion unit WLC2 may include a second base resin BS2, a second scatterer SCT2, and a second wavelength shifter WLS2.

The second base resin BS2 may contain a material having relatively high light transmittance. The second base resin BS2 may be made of a transparent organic material.

The second scatterer SCT2 may have a refractive index different from that of the second base resin BS2, and may form an optical interface with the second base resin BS2. For example, the second scatterer SCT2 may include light scattering materials or light scattering particles that scatter at least a part of the transmitted light.

The second wavelength shifter WLS2 may convert or shift a peak wavelength of incident light to a second peak wavelength different from the first peak wavelength of the first wavelength shifter WLS1. For example, the second wavelength shifter WLS2 may convert blue light provided from the display device into green light having a single peak wavelength in the range of about 510 nm to about 550 nm to emit the converted light. The second wavelength shifter WLS2 may be a quantum dot, a quantum rod, or a phosphor. The second wavelength shifter WLS2 may contain a material having the same effect as the material exemplified for the first wavelength shifter WLS1.

The light transmitting unit LTU may be disposed in the third light-emitting area LA3 on the first capping layer CAP1. The light transmitting unit LTU may be surrounded by the first upper bank BK1. The light transmitting unit LTU may maintain the peak wavelength of the incident light to transmit the incident light. The light transmitting unit LTU may include a third base resin BS3 and a third scatterer SCT3.

The third base resin BS3 may contain a material having relatively high light transmittance. The third base resin BS3 may be made of a transparent organic material.

The third scatterer SCT3 may have a refractive index different from that of the third base resin BS3, and may form an optical interface with the third base resin BS3. For example, the third scatterer SCT3 may include light scattering materials or light scattering particles that scatter at least a part of the transmitted light.

The filling layer FIL may be disposed between the second protective layer PAS2 and the second capping layer CAP2. The filling layer FIL may be in direct contact with the second protective layer PAS2 and the second capping layer CAP2.

In FIGS. 1, 2, and 3, the upper banks BK1 and BK2, the first, second, and third color filters CF1, CF2, and CF3, the capping layers CAP1 and CAP2, the wavelength conversion units WLC1 and WLC2, and the light transmitting unit LTU are disposed in the second base portion SUB2, and although only a structure in which the first substrate 100 and the second substrate 200 are coupled through the filling layer FIL is illustrated, the present disclosure is not limited thereto. That is, the second base portion SUB2 may be omitted, the first and second wavelength conversion units WLC1 and WLC2 may be disposed on the light-emitting element layer EML, and the first, second, and third color filters CF1, CF2, and CF3 may also be disposed on the first and second wavelength conversion units WLC1 and WLC2. In an example embodiment in which the second base portion SUB2 is omitted, the filling layer FIL may be omitted, and an encapsulation layer may be further disposed on the first to third color filters CF1, CF2, and CF3. For example, the encapsulation layer may include at least one inorganic film to prevent the penetration of oxygen or moisture. In addition, the encapsulation layer may include at least one organic film to protect the display device from foreign matter such as dust.

Figure 4:
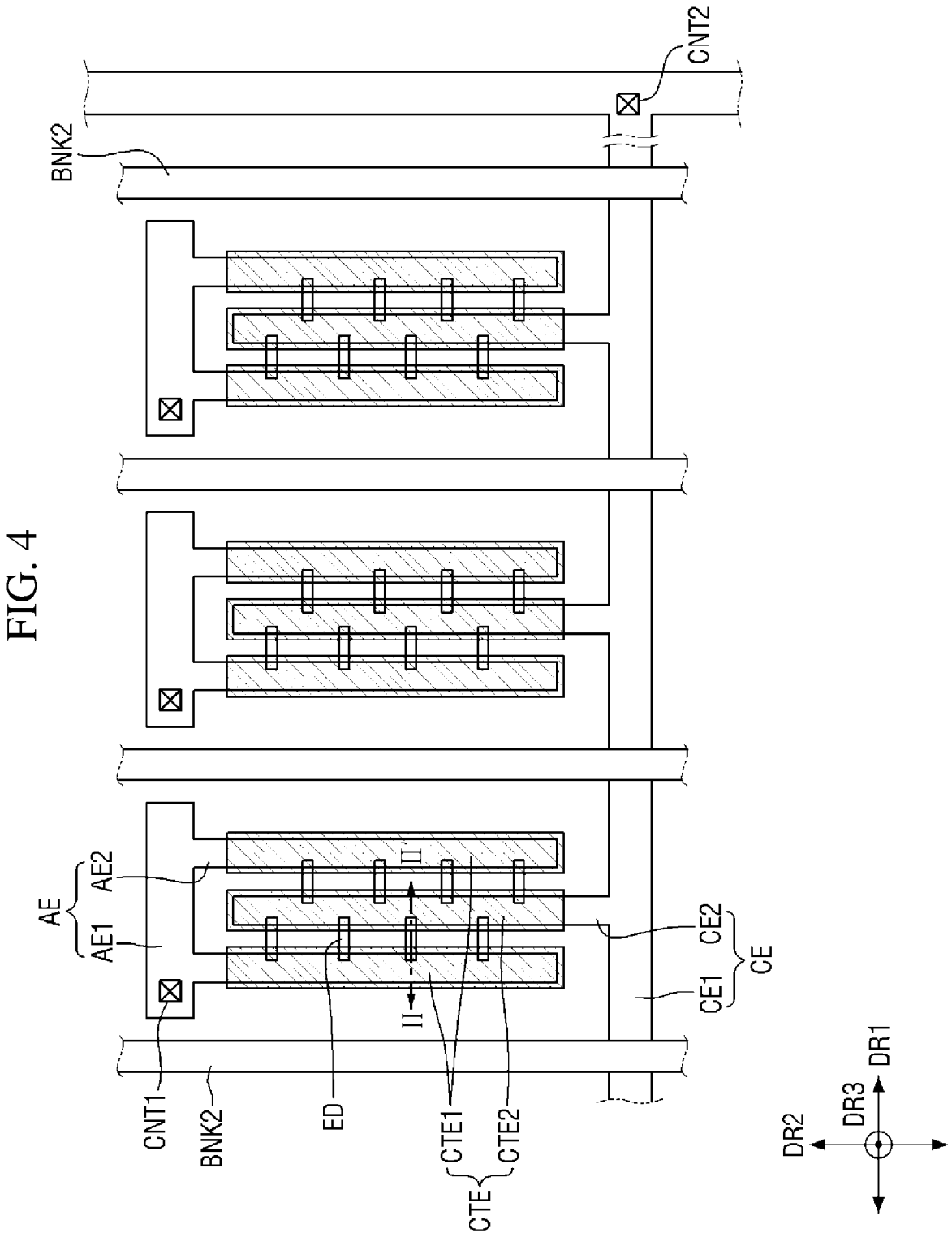
FIG. 4 is a plan view showing one pixel of the display device according to an example embodiment.
Figure 5:
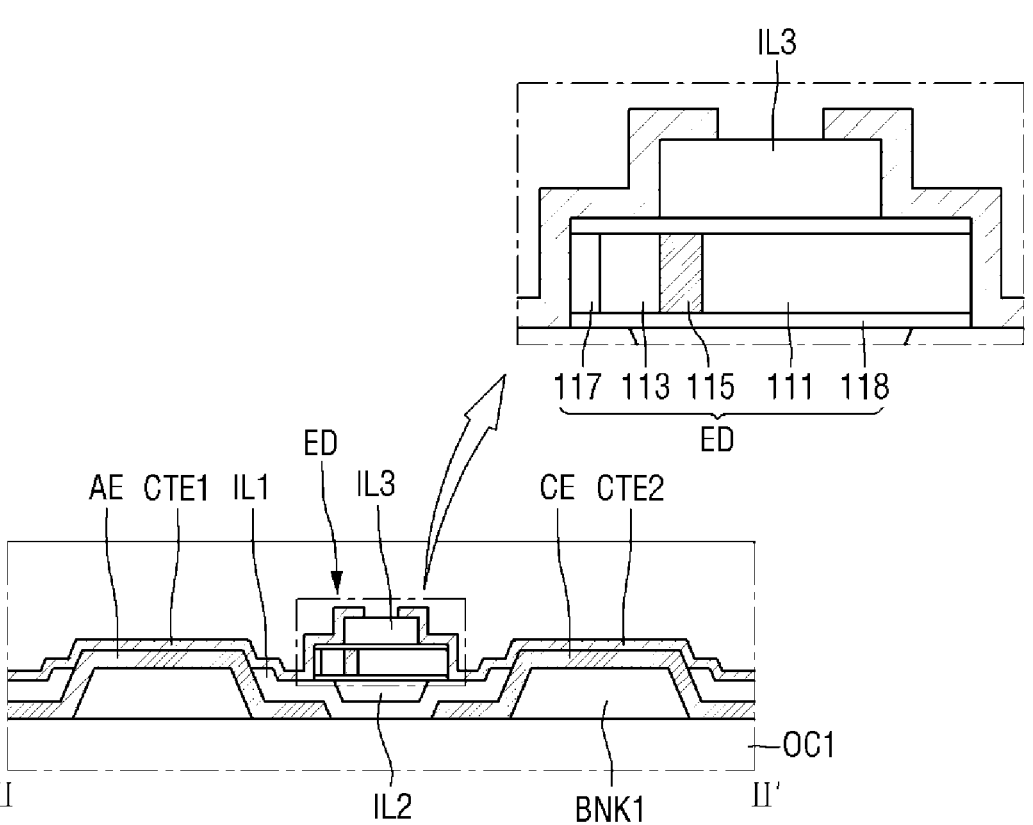
FIG. 5 is a cross-sectional view taken along line II-IP of FIG. 4.

FIG. 4 is a plan view showing one pixel of the display device according to an example embodiment. FIG. 5 is a cross-sectional view taken along line II-IP of FIG. 4.

Referring to FIGS. 4 and 5 along with FIG. 3, each of the plurality of pixels PX (in FIG. 1) may include first, second, and third sub-pixels. Each of the first, second, and third sub-pixels may correspond to each of the first, second, and third light-emitting areas LA1, LA2, and LA3. A light-emitting element ED of each of the first, second, and third sub-pixels may emit light through the first, second, and third light-emitting areas LA1, LA2, and LA3.

Each of the first, second, and third sub-pixels may emit light of the same color. For example, each of the first, second, and third sub-pixels may include the same type of light-emitting element ED, and may emit light of a third color or blue light. As another example, the first sub-pixel may emit light of a first color or red light, the second sub-pixel may emit light of a second color or green light, and the third sub-pixel may emit light of a third color or blue light.

Each of the first, second, and third sub-pixels may include the first and second electrodes AE and CE, the light-emitting element ED, a plurality of contact electrodes CTE, and a plurality of second lower banks BNK2.

The first and second electrodes AE and CE may be electrically connected to the light-emitting element ED to receive a predetermined voltage, and the light-emitting element ED may emit light of a specific wavelength band. At least a part of the first and second electrodes AE and CE may form an electric field in a pixel, and the light-emitting element ED may be aligned by the electric field.

For example, the first electrode AE may be a pixel electrode separated for each of the first, second, and third sub-pixels, and the second electrode CE may be a common electrode commonly connected to the first, second, and third sub-pixels. One of the first electrode AE and the second electrode CE may be an anode of the light-emitting element ED, and the other may be a cathode of the light-emitting element ED.

The first electrode AE may include a first electrode stem portion AE1 extending in the first direction DR1 and at least one first electrode branch portion AE2 branched from the first electrode stem portion AE1 and extending in the second direction DR2.

The first electrode stem portion AE1 of each of the first, second, and third sub-pixels may be spaced apart from the first electrode stem portion AE1 of an adjacent sub-pixel, and the first electrode stem portion AE1 may be disposed on a virtual extension line with the first electrode stem portion AE1 of the sub-pixel adjacent in the first direction DR1. The first electrode stem portion AE1 of each of the first, second, and third sub-pixels may receive different signals and may be independently driven.

The first electrode branch portion AE2 may be branched from the first electrode stem portion AE1 to extend in the second direction DR2. One end of the first electrode branch portion AE2 may be connected to the first electrode stem portion AE1, and the other end of the first electrode branch portion AE2 may be spaced apart from a second electrode stem portion CE1 facing the first electrode stem portion AE1.

The second electrode CE may include the second electrode stem portion CE1 extending in the first direction DR1, and a second electrode branch portion CE2 branched from the second electrode stem portion CE1 to extend in the second direction DR2. The second electrode stem portion CE1 of each of the first, second, and third sub-pixels may be connected to the second electrode stem portion CE1 of an adjacent sub-pixel. The second electrode stem portion CE1 may extend in the first direction DR1 to cross the plurality of pixels. The second electrode stem portion CE1 may be connected to an outer portion of the display area DA or a portion extending in one direction from the non-display area NDA.

The second electrode branch portion CE2 may be spaced apart from the first electrode branch portion AE2 to face each other. One end of the second electrode branch portion CE2 may be connected to the second electrode stem portion CE1, and the other end of the second electrode branch portion CE2 may be spaced apart from the first electrode stem portion AE1. In addition, the second electrode branch portion CE2 is disposed between two adjacent first electrode branch portions AE2

The first electrode AE may be electrically connected to the thin film transistor layer TFTL of the display device through a first contact hole CNT1, and the second electrode CE may be electrically connected to the thin film transistor layer TFTL of the display device through a second contact hole CNT2. For example, the first contact hole CNT1 may be disposed in each of the plurality of first electrode stem portions AE1, and the second contact hole CNT2 may be disposed in the second electrode stem portion CE1, but the present disclosure is not limited thereto.

The second lower bank BNK2 may be disposed at a boundary between the plurality of pixels. The plurality of first electrode stem portions AE1 may be spaced apart from each other based on the second lower bank BNK2. The second lower bank BNK2 may extend in the second direction DR2, and may be disposed at a boundary of pixels SP arranged in the first direction DR1. Additionally, the second lower bank BNK2 may also be disposed at a boundary of the pixels SP arranged in the second direction DR2. The second lower bank BNK2 may define a boundary between the plurality of pixels.

When manufacturing the display device, the second lower bank BNK2 may prevent ink from crossing the boundary of the pixels SP when the ink in which the light-emitting element ED is dispersed is sprayed. The second lower bank BNK2 may separate so that the inks in which different light-emitting elements ED are dispersed are not mixed.

The light-emitting element ED may be disposed between the first electrode AE and the second electrode CE. One end of the light-emitting element ED may be connected to the first electrode AE, and the other end of the light-emitting element ED may be connected to the second electrode CE. That is, one end of the light-emitting element ED may be connected to the second electrode branch portion CE2 and the other end of the light-emitting element ED may be connected to the first electrode branch portion AE2.

The plurality of light-emitting elements ED may be disposed to be spaced apart from each other along the first and second directions DR1 and DR2, and may be substantially aligned in parallel with each other. The spacing between the light-emitting elements ED is not particularly limited.

The plurality of light-emitting elements ED may include an active layer having the same material, and may emit light of the same wavelength band or light of the same color. The first to third sub-pixels may emit light of the same color. For example, the plurality of light-emitting elements ED may emit light of a third color or blue light having a peak wavelength in the range of about 440 nm to about 480 nm.

The contact electrode CTE may include first and second contact electrodes CTE1 and CTE2. The first contact electrode CTE1 may cover the first electrode branch portion AE2 and a part of the light-emitting element ED, and may electrically connect the first electrode branch portion AE2 and the light-emitting element ED. The second contact electrode CTE2 may cover the second electrode branch portion CE2 and another part of the light-emitting element ED, and may electrically connect the second electrode branch portion CE2 and the light-emitting element ED The first contact electrode CTE1 may be disposed on the first electrode branch portion AE2 to extend in the second direction DR2. The first contact electrode CTE1 may be in direct contact with one end of the light-emitting element ED. The light-emitting element ED may be electrically connected to the first electrode AE through the first contact electrode CTE1.

The second contact electrode CTE2 may be disposed on the second electrode branch portion CE2 to extend in the second direction DR2. The second contact electrode CTE2 may be spaced apart from the first contact electrode CTE1 in the first direction DR1. The second contact electrode CTE2 may be in direct contact with the other end of the light-emitting element ED. The light-emitting element ED may be electrically connected to the second electrode CE through the second contact electrode CTE2.

The light-emitting element layer EML of the display device may be disposed on the thin film transistor layer TFTL, and may include first, second, and third insulating layers ILL IL2, and IL3.

The plurality of first lower banks BNK1 may be disposed in each of the first, second, and third light-emitting areas LA1, LA2, and LA3. Each of the plurality of first lower banks BNK1 may correspond to the first electrode AE or the second electrode CE. Each of the first and second electrodes AE and CE may be disposed on a corresponding first lower bank BNK1.

The plurality of first lower banks BNK1 may be disposed on the first planarization layer OC1, and a side surface of each of the plurality of first lower banks BNK1 may be inclined from the first planarization layer OC1. An inclined surface of the first lower bank BNK1 may reflect the light emitted from the light-emitting element ED.

The first electrode stem portion AE1 may include the first contact hole CNT1 passing through the first planarization layer OC1. The first electrode stem portion AE1 may be electrically connected to the thin film transistor TFT through the first contact hole CNT1.

The second electrode stem portion CE1 may extend in the first direction DR1, and may also be disposed in a non-emitting area in which the light-emitting element ED is not disposed. The second electrode stem portion CE1 may include the second contact hole CNT2 passing through the first planarization layer OC1. The second electrode stem portion CE1 may be electrically connected to a power electrode through the second contact hole CNT2. The second electrode CE may receive a predetermined electrical signal from the power electrode.

The first and second electrodes AE and CE may contain a transparent conductive material. The first and second electrodes AE and CE may contain a conductive material having high reflectivity. The first and second electrodes AE and CE may have a structure in which one or more layers of a transparent conductive material and a metal having high reflectivity are stacked, or may be formed as a single layer including the transparent conductive material and the metal.

The first insulating layer IL1 may be disposed on the first planarization layer OC1, the first electrode AE, and the second electrode CE. The first insulating layer IL1 may cover a portion of each of the first and second electrodes AE and CE. That is, the first insulating layer IL1 is disposed between the first and second electrodes AE and CE so that one end of the first insulating layer IL1 overlaps one end of the first electrode AE and the other end of the first insulating layer IL1 overlaps one end of the second electrode CE.

The first insulating layer IL1 may protect the first and second electrodes AE and CE, and may insulate the first and second electrodes AE and CE from each other. The first insulating layer IL1 may prevent the light-emitting element ED from being damaged by direct contact with other members.

The light-emitting element ED may be disposed between the first electrode AE and the second electrode CE on the first and second insulating layers IL1 and IL2. One end of the light-emitting element ED may be connected to the first electrode AE, and the other end of the light-emitting element ED may be connected to the second electrode CE.

The third insulating layer IL3 may be partially disposed on the light-emitting element ED disposed between the first and second electrodes AE and CE. The third insulating layer IL3 may partially surround an outer surface of the light-emitting element ED. The third insulating layer IL3 may protect the light-emitting element ED. The third insulating layer IL3 may surround the outer surface of the light-emitting element ED.

The contact electrode CTE may include first and second contact electrodes CTE1 and CTE2. The first contact electrode CTE1 may cover the first electrode branch portion AE2 and a part of the light-emitting element ED, and may electrically connect the first electrode branch portion AE2 and the light-emitting element ED. The second contact electrode CTE2 may cover the second electrode branch portion CE2 and another part of the light-emitting element ED, and may electrically connect the second electrode branch portion CE2 and the light-emitting element ED.

The first contact electrode CTE1 may be disposed on the first electrode branch portion AE2 to extend in the second direction DR2. The first contact electrode CTE1 may be in contact with one end of the light-emitting element ED. The light-emitting element ED may be electrically connected to the first electrode AE through the first contact electrode CTE1.

The second contact electrode CTE2 may be disposed on the second electrode branch portion CE2 to extend in the second direction DR2. The second contact electrode CTE2 may be spaced apart from the first contact electrode CTE1 in the first direction DR1. The second contact electrode CTE2 may be in contact with the other end of the light-emitting element ED. The light-emitting element ED may be electrically connected to the second electrode CE through the second contact electrode CTE2.

The contact electrode CTE may contain a conductive material.

Figure 6:
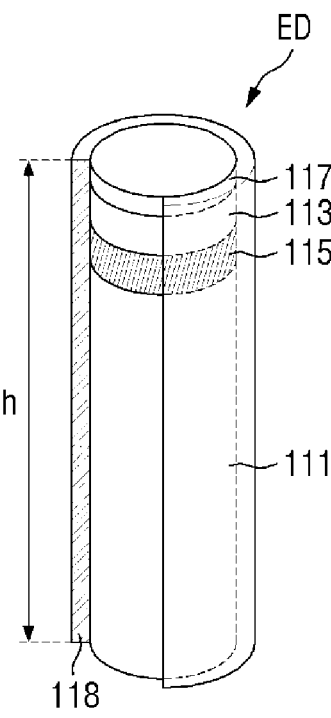
FIG. 6 is a view showing a light-emitting element according to an example embodiment.

FIG. 6 is a view showing a light-emitting element according to an example embodiment.

Referring to FIG. 6, the light-emitting element ED may be a light-emitting diode. For example, the light-emitting element ED may have a size of a micrometer or a nanometer, and may be an inorganic light-emitting diode containing an inorganic material. The inorganic light-emitting diode may be aligned between two electrodes according to an electric field formed in a specific direction between the two electrodes facing each other.

The light-emitting element ED may have a shape extending in one direction. The light-emitting element ED may have a shape such as a rod, a wire, or a tube. The light-emitting element ED may include a first semiconductor layer 111, a second semiconductor layer 113, an active layer 115, an electrode layer 117, and an insulating layer 118.

The first semiconductor layer 111 may be an n-type semiconductor. The second semiconductor layer 113 may be disposed on the active layer 115. Each of the first and second semiconductor layers 111 and 113 may be formed of one layer, but the present disclosure is not limited thereto.

The active layer 115 may be disposed between the first and second semiconductor layers 111 and 113. The active layer 115 may contain a material having a single or multiple quantum well structure. When the active layer 115 contains a material having a multiple quantum well structure, a plurality of quantum layers and well layers may be alternately stacked.

Light emitted from the active layer 115 may be emitted in a longitudinal direction of the light-emitting element ED, and may also be emitted to both side surfaces. The directionality of the light emitted from the active layer 115 may not be limited.

The electrode layer 117 may be an ohmic contact electrode. As another example, the electrode layer 117 may be a Schottky contact electrode. The light-emitting element ED may include at least one electrode layer 117.

The insulating layer 118 may surround outer surfaces of the plurality of semiconductor layers and the electrode layers. The insulating layer 118 may surround an outer surface of the active layer 115, and may extend in a direction in which the light-emitting element ED extends. The insulating layer 118 may protect the light-emitting element ED.

The insulating layer 118 may contain a material having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), and the like.

An outer surface of the insulating layer 118 may be surface-treated. When manufacturing a display device, the light-emitting element ED may be sprayed onto the electrode in a state of being dispersed in a predetermined ink to be aligned.

Figure 7:
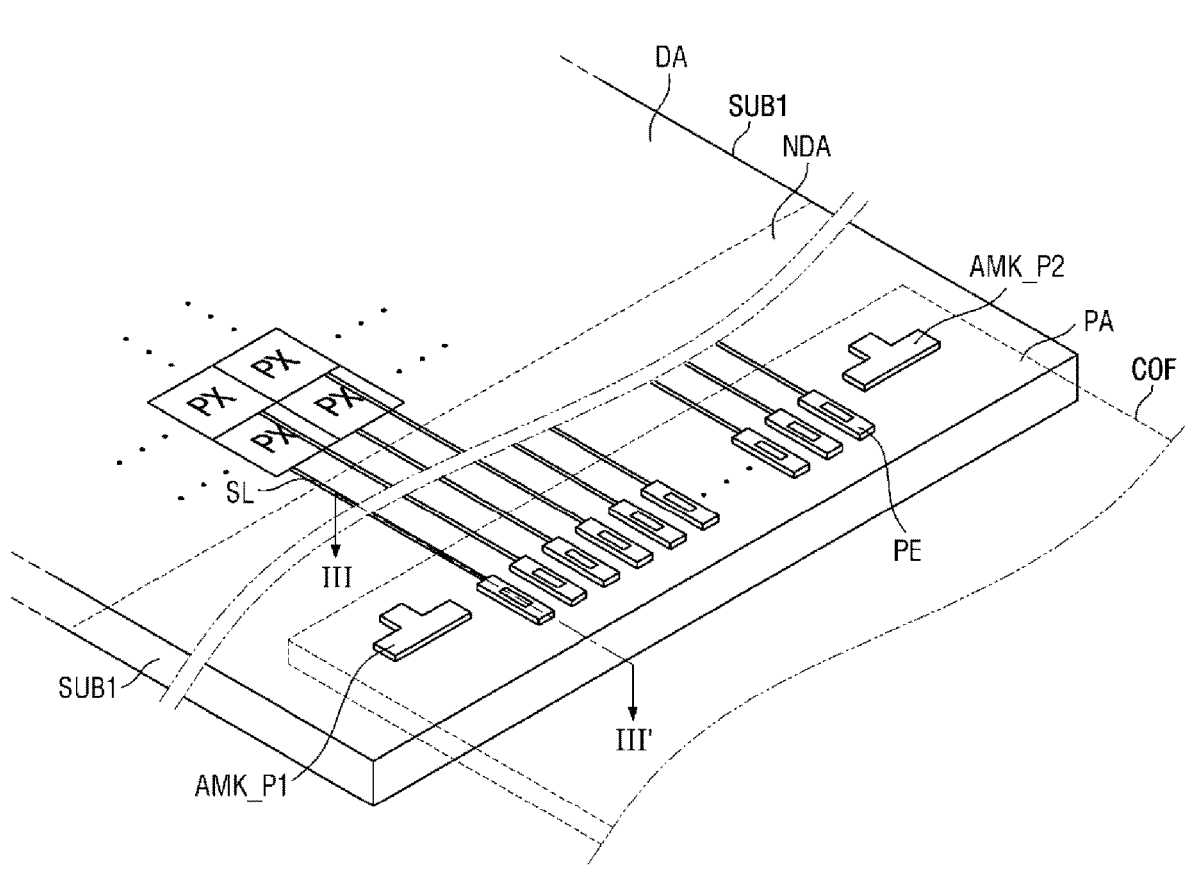
FIG. 7 is a perspective view showing a part of the display device according to an example embodiment.
Figure 7:
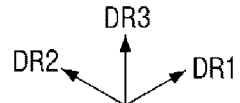
Figure 8:
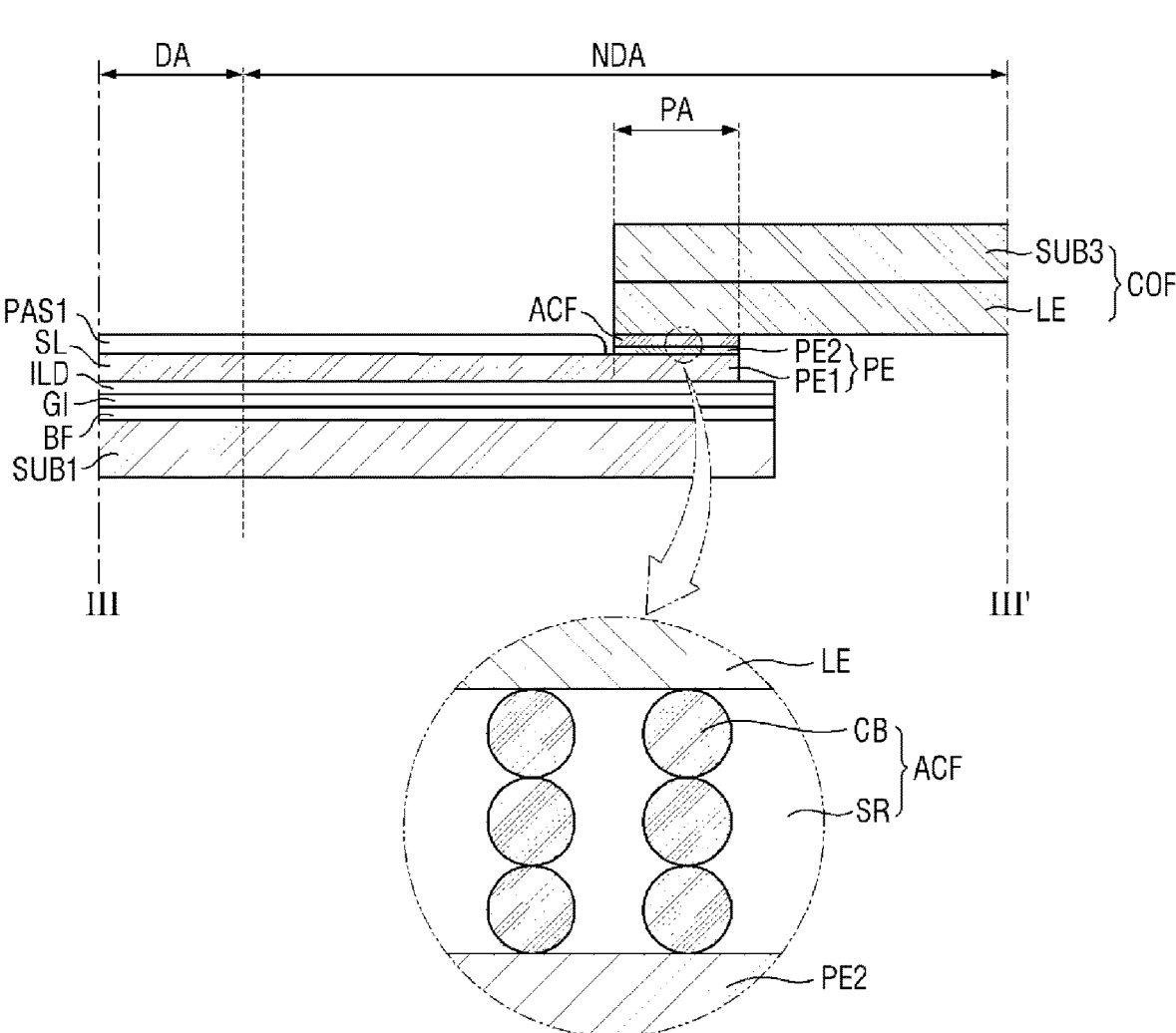
FIG. 8 is a cross-sectional view taken along line of FIG. 7.

FIG. 7 is a perspective view showing a part of the display device according to an example embodiment. FIG. 8 is a cross-sectional view taken along line of FIG. 7. FIG. 7 is a perspective view showing the non-display area NDA (a fourth non-display area NDA4) and a part of the display area DA of the display device according to an example embodiment.

Referring to FIGS. 7 and 8, a plurality of pad electrodes PE arranged along the first direction, a first panel alignment mark AMK_P1 positioned at the other side of the plurality of pad electrodes PE in the first direction DR1, and a second panel alignment mark AMK_P2 positioned at one side of the plurality of pad electrodes PE in the first direction DR1 may be disposed in the pad area PA. Each of the pad electrodes PE may be electrically connected to the pixels PX of the display area DA through a signal line SL.

The printed circuit film COF may be attached to the plurality of pad electrodes PE disposed in the pad area PA.

As shown in FIG. 8, the pad electrode PE may include a first pad portion PE1 disposed on the interlayer insulating film ILD and a second pad portion PE2 disposed on the first pad portion PE1. The second pad portion PE2 may be directly disposed on an upper surface of the first pad portion PE1. The first pad portion PE1 may be physically connected to the signal line SL. The first pad portion PE1 and the signal line SL may be disposed on the same layer, and may contain the same material. The first pad portion PE1 and the second pad portion PE2 may contain different materials. For example, the first pad portion PE1 may be provided in a form of a single film made of one material selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu), or in a form of a stacked film in which two or more materials selected from the exemplified metals are stacked. For example, the first pad portion PE1 may be a stacked film in which titanium (Ti) and copper (Cu) are stacked, but the present disclosure is not limited thereto.

The first pad portion PE1 may be disposed on the same layer as the source electrode SE and the drain electrode DE described in FIG. 3. However, the present disclosure is not limited thereto, and the first pad portion PE1 may be disposed on the same layer as the gate electrode GE described in FIG. 3.

The second pad portion PE2 may contain a material different from that of the first pad portion PE1. The second pad portion PE2 may contain a transparent conductive material. For example, the second pad portion PE2 may contain indium tin oxide (ITO) or indium zinc oxide (IZO), but the present disclosure is not limited thereto.

The first protective layer PAS1 may expose the upper surface of the first pad portion PE1 in the pad area PA. The second pad portion PE2 may be directly disposed on the upper surface of the first pad portion PE1 exposed by the first protective layer PAS1.

The printed circuit film COF may include a third base portion SUB3 and a lead electrode LE disposed on a lower surface of the third base portion SUB3. The lead electrode LE may be provided in plural. An anisotropic conductive film ACF may be interposed between the lead electrode LE and the pad electrode PE. The anisotropic conductive film ACF may electrically connect the lead electrode LE and the pad electrode PE. The anisotropic conductive film ACF may include an insulating resin SR and a plurality of conductive balls CB dispersed in the insulating resin SR. The lead electrode LE and the pad electrode PE may be electrically connected through the plurality of conductive balls CB.

For example, the lead electrode LE may be provided in a form of a single film made of one material selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), or tin (Sn), in a form of a stacked film in which two or more materials selected from the exemplified metals are stacked, or in a form in which a surface of one material selected from the exemplified metals is coated with another material selected from the exemplified metals. For example, the lead electrode LE may be provided in a form in which tin (Sn) is coated on a surface of copper (Cu) (e.g., a lower surface and a side surface facing the pad electrode PE).

Figure 9:
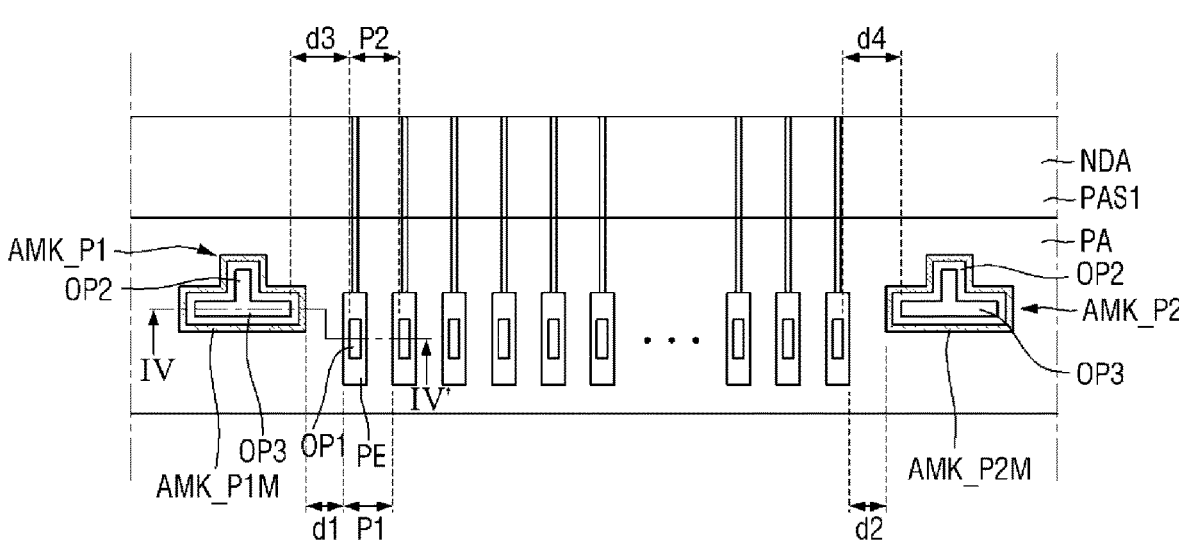
FIG. 9 is a plan view showing a pad area of a first substrate according to an example embodiment.
Figure 9:
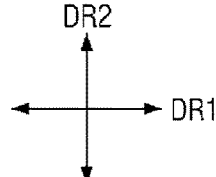
Figure 10:
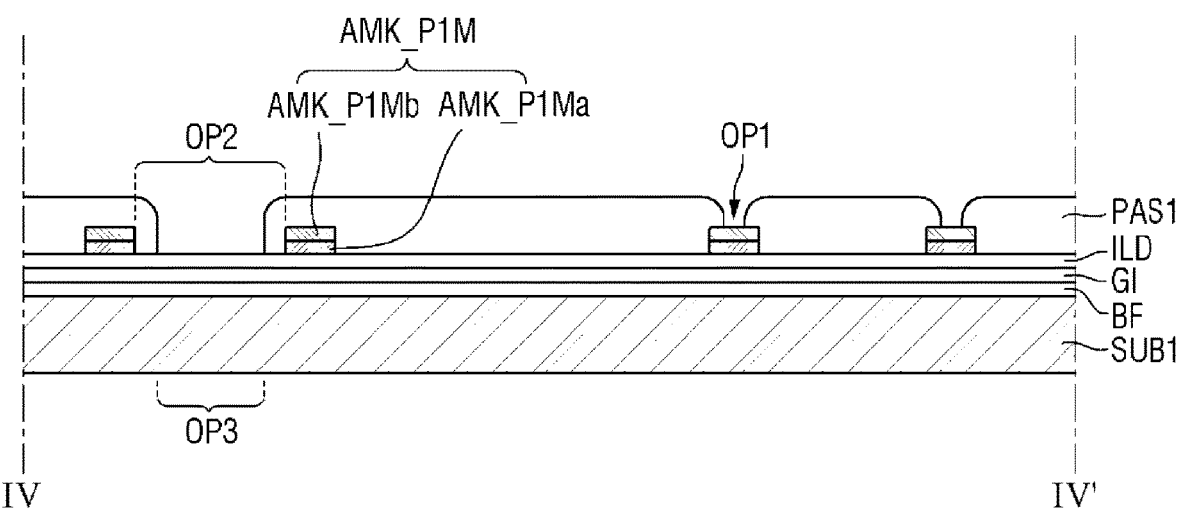
FIG. 10 is a cross-sectional view taken along line IV-IV' of FIG. 9.
Figure 11:
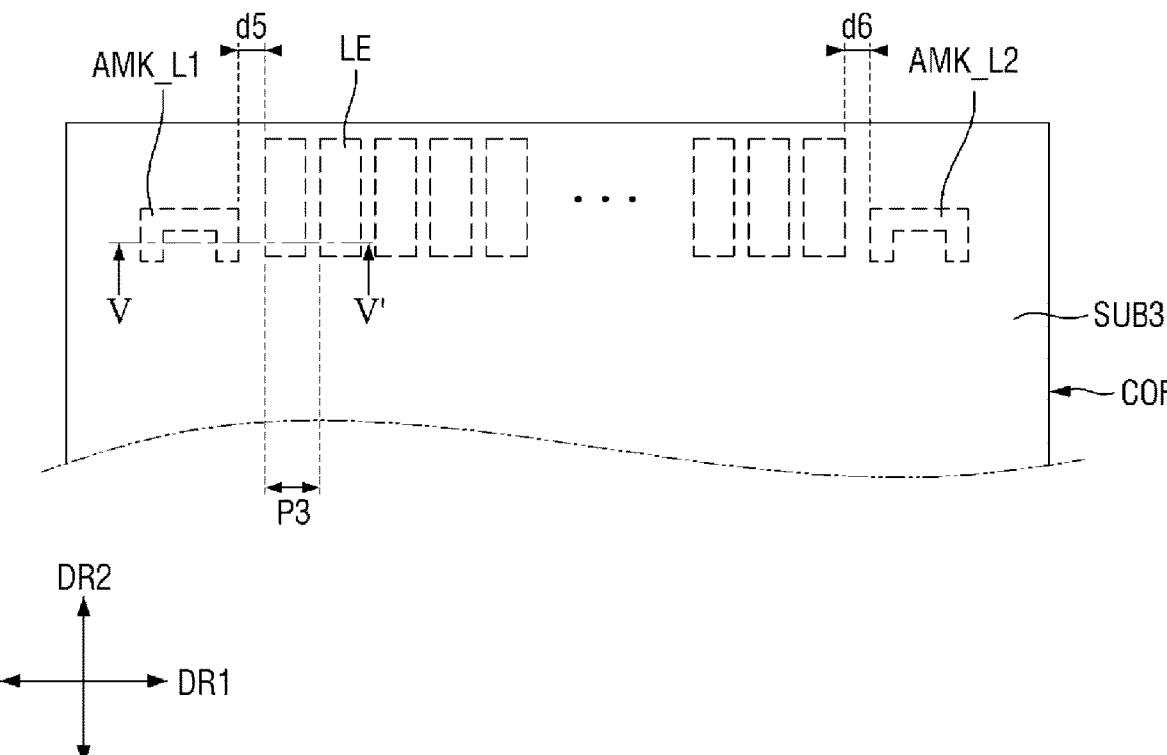
FIG. 11 is a plan view of a printed circuit film according to an example embodiment.
Figure 12:
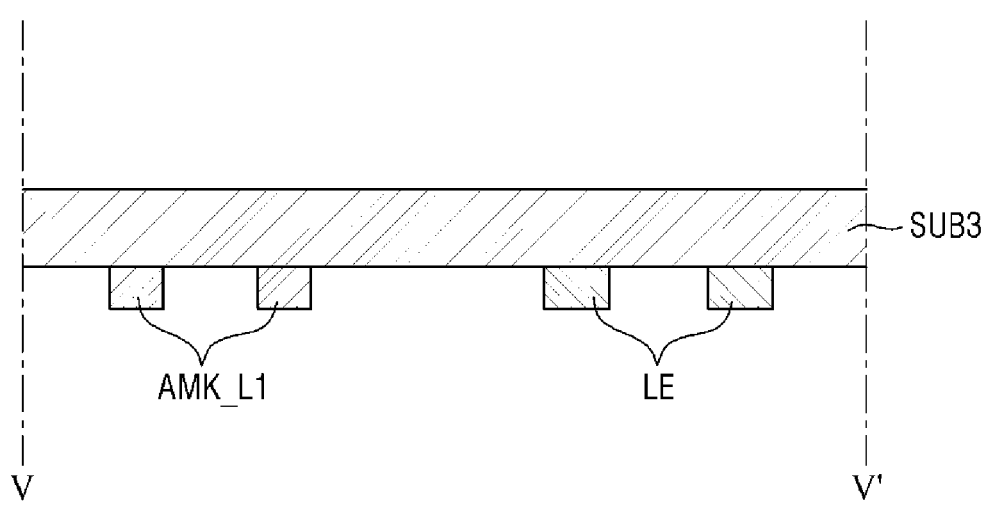
FIG. 12 is a cross-sectional view taken along line V-V' of FIG. 11.
Figure 13:
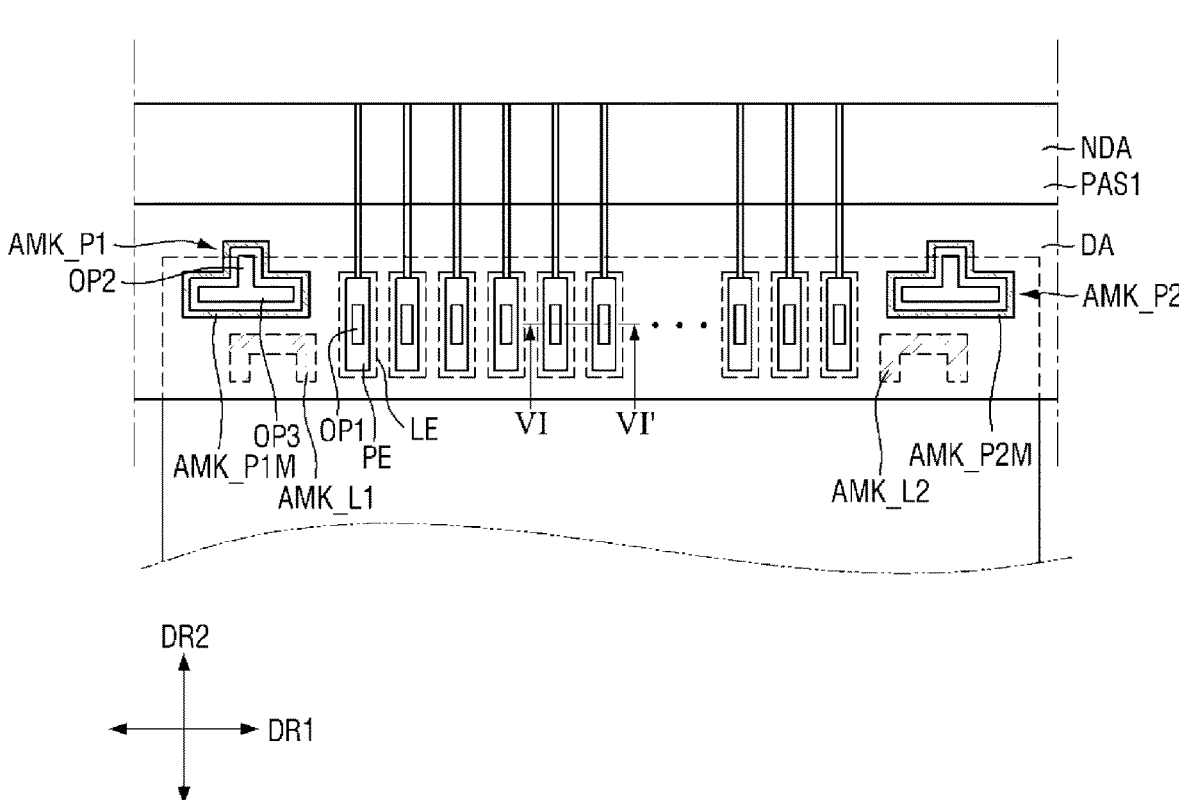
FIG. 13 is a plan view showing the first substrate and a printed circuit film attached to the first substrate according to an example embodiment.

FIG. 9 is a plan view showing a pad area of a first substrate according to an example embodiment. FIG. 10 is a cross-sectional view taken along line IV-IV' of FIG. 9. FIG. 11 is a plan view of a printed circuit film according to an example embodiment. FIG. 12 is a cross-sectional view taken along line V-V' of FIG. 11. FIG. 13 is a plan view showing a first substrate and a printed circuit film attached to the first substrate according to an example embodiment.

Referring to FIGS. 9, 10, 11, 12, and 13, the first protective layer PAS1 may be disposed on the pad electrodes PE, and a first open portion OP1 exposing a part of an upper surface of each pad electrode PE is defined in the first protective layer PAS1.

The first panel alignment mark AMK_P1 may include a first panel alignment metal portion AMK_P1M, and a second open portion OP2 penetrating the first panel alignment metal portion AMK_P1M in the thickness direction and surrounded by the first panel alignment metal portion AMK_P1M on a plane is defined in the first panel alignment mark AMK_P1. The first protective layer PAS1 may be further disposed on the first panel alignment metal portion AMK_P1M. A third open portion OP3 completely penetrating the first protective layer PAS1 in the thickness direction is defined in the first panel alignment mark AMK_P1.

The third open portion OP3 may be surrounded by an inner surface of the first protective layer PAS1 on a plane. In addition, the third open portion OP3 may be completely surrounded by the second open portion OP2 on a plane.

A first panel alignment mark AMK_P1 may have a symmetrical shape in the first direction DR1.

The first panel alignment mark AMK_P1 and the second panel alignment mark AMK_P2 described above may have the same structure. That is, the second panel alignment mark AMK_P2 may include a second panel alignment metal portion AMK_P2M and a second open portion OP2 penetrating the second panel alignment metal portion AMK_P2M in the thickness direction and surrounded by the second panel alignment metal portion AMK_P2M on a plane.

The first protective layer PAS1 may be further disposed on the second panel alignment mark AMK_P2.

A third open portion OP3 that completely penetrates the first protective layer PAS1 in the thickness direction is defined in the second panel alignment mark AMK_P2, and the third open portion OP3 may be surrounded by the inner surface of the first protective layer PAS1 on a plane.

Meanwhile, each of the first panel alignment metal portion AMK_P1M of the first panel alignment mark AMK_P1 and the second panel alignment metal portion AMK_P2M of the second panel alignment mark AMK_P2 may be disposed based on the arrangement of the plurality of pad electrodes PE.

As shown in FIG. 9, the plurality of pad electrodes PE may be arranged with a constant first pitch P1, and each of the first panel alignment mark AMK_P1 and the second panel alignment mark AMK_P2 may be disposed with predetermined separation distances d1 and d2 from the adjacent pad electrode PE in the first direction DR1.

In addition, since each of the plurality of first open portions OP1 is formed at the same position inside the corresponding pad electrode PE on a plane, and as described above, since the pad electrodes PE are arranged with the same first pitch P1, a second pitch P2 of the plurality of first open portions OP1 may be the same as the first pitch P1. Each of the third open portion OP3 of the first panel alignment mark AMK_P1 and the third open portion OP3 of the second panel alignment mark AMK_P2 may be disposed based on the arrangement of the first open portions OP1 exposing a part of the upper surface of the plurality of pad electrodes PE.

As shown in FIG. 11, the printed circuit film COF may further include the first lead alignment mark AMK_L1 positioned on the other side of a plurality of lead electrodes LE in the first direction DR1 on the lower surface of the third base portion SUB3, and a second lead alignment mark AMK_L2 positioned on one side of the plurality of lead electrodes LE in the first direction DR1. As shown in FIG. 12, the first lead alignment mark AMK_L1 positioned on the other side of the plurality of lead electrodes LE in the first direction DR1 and the second lead alignment mark AMK_L2 positioned on one side of the plurality of lead electrodes LE in the first direction DR1 may be positioned on the same layer.

Each of the first lead alignment mark AMK_L1 and the second lead alignment mark AMK_L2 may be disposed based on the arrangement of the plurality of lead electrodes LE. That is, as shown in FIG. 11, the plurality of lead electrodes LE may be arranged with a constant third pitch P3, and each of the first lead alignment mark AMK_L1 and the second lead alignment mark AMK_L2 may be disposed with predetermined separation distances d3 and d4 from the adjacent lead electrode LE in the first direction DR1.

FIG. 13 shows the printed circuit film COF attached to the pad area PA of the first substrate 100 when the pad electrodes PE of the first substrate 100 (in FIG. 1) and the lead electrodes LE of the printed circuit film COF are completely aligned.

Meanwhile, even though the printed circuit film COF is attached to the pad area PA while the pad electrode PE and the lead electrode LE are aligned, the first open portion OP1 exposing the upper surface of the pad electrode PE substantially connected through the lead electrode LE and the anisotropic conductive film ACF should also be considered importantly when attaching to the pad area PA of the printed circuit film COF.

Figure 14:
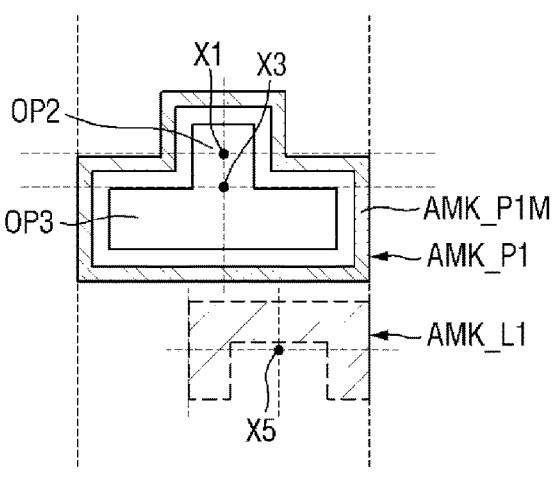
FIG. 14 is a plan view showing the arrangement of a first panel alignment mark, a second panel alignment mark, a first lead alignment mark, and a second lead alignment mark, according to an example embodiment.
Figure 14:
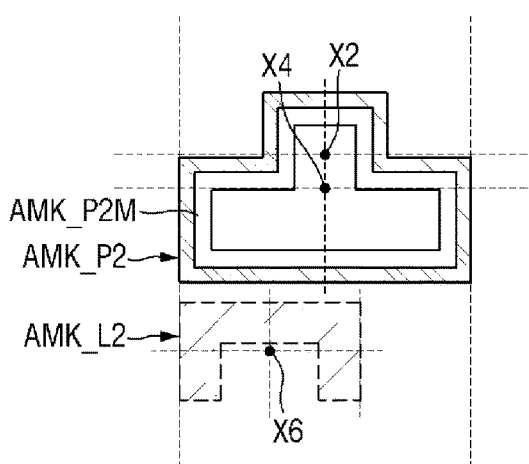
Figure 14:
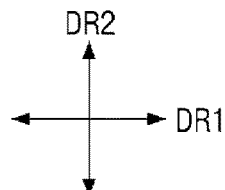
Figure 15:
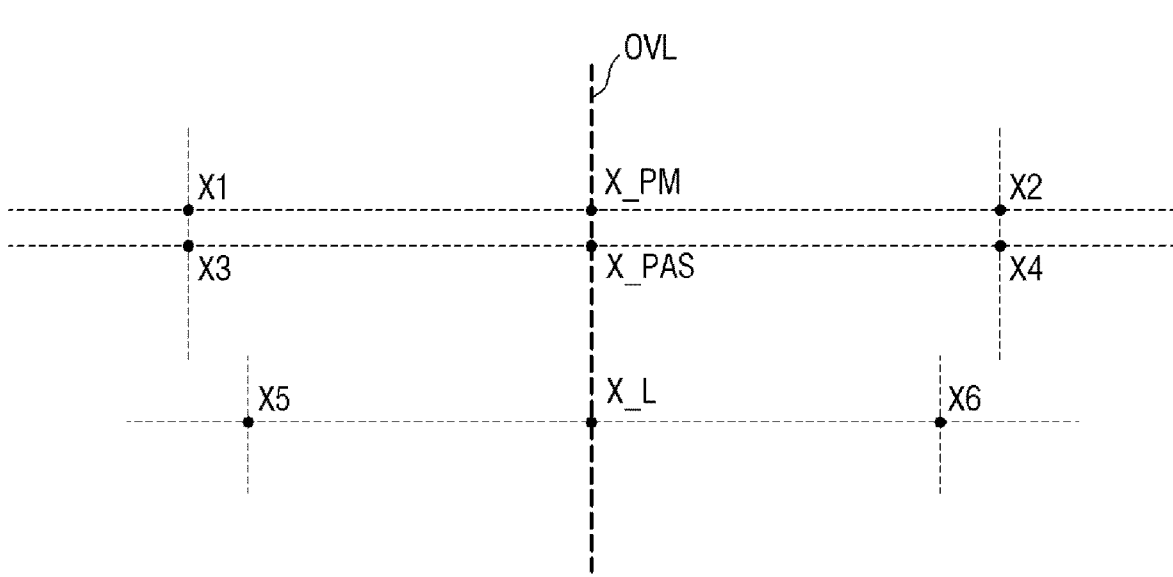
FIG. 15 is a view showing a process of aligning an overlapping line and a third equal division line when the printed circuit film according to an example embodiment is attached to the pad area of the first substrate.
Figure 15:
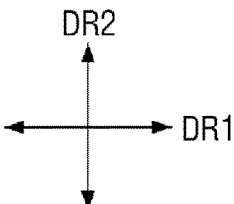
Figure 16:
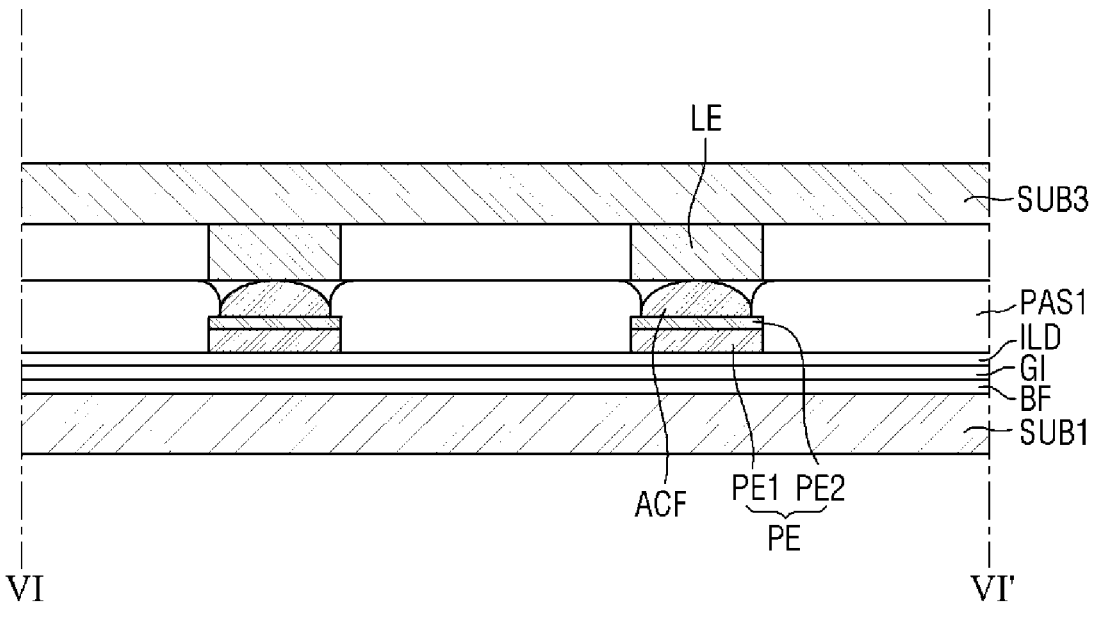
FIG. 16 is a cross-sectional view taken along line VI-VI' of FIG. 13.

FIG. 14 is a plan view showing the arrangement of a first panel alignment mark, a second panel alignment mark, a first lead alignment mark, and a second lead alignment mark, according to an example embodiment. FIG. 15 is a view showing a process of aligning an overlapping line and a third equal division line when a printed circuit film according to an example embodiment is attached to a pad area of a first substrate. FIG. 16 is a cross-sectional view taken along line VI-VI' of FIG. 13.

Referring to FIGS. 14 and 15, when the printed circuit film COF is attached to the pad area PA, based on the first direction DR1, it may be performed in consideration of a first equal division point X_PM between the first panel alignment metal portion AMK_P1M of the first panel alignment mark AMK_P1 and the second panel alignment metal portion AMK_P2M of the second panel alignment mark AMK_P2 (i.e., an equal division point that equally divides an extending line connecting an equal division point X1 of the first panel alignment metal portion AMK_P1M of the first panel alignment mark AMK_P1 and an equal division point X2 of the second panel alignment metal portion AMK_P2M of the second panel alignment mark AMK_P2 in the first direction DR1), a second equal division point X_PAS between the third open portion OP3 of the first panel alignment mark AMK_P1 and the third open portion OP3 of the second panel alignment mark AMK_P2 (i.e., an equal division point that equally divides an extending line connecting an equal division point X3 of the first lead alignment mark AMK_L1 and an equal division point X4 of the second lead alignment mark AMK_L2 in the first direction DR1), and a third equal division point X_L between the first lead alignment mark AMK_L1 and the second lead alignment mark AMK_L2 (i.e., an equal division point X5 of the first lead alignment mark AMK_L1 and an equal division point X6 of the second lead alignment mark AMK_L2).

That is, the printed circuit film COF may be attached to the pad area PA so that an overlapping line OVL connecting the first equal division point X_PM and the second equal division point X_PAS and extending along the second direction DR2 crossing the first direction DR1 and the third equal division point X_L meet.

As described above, when attaching the printed circuit film COF to the pad area PA, in the display device according to the present example embodiment, the panel alignment marks AMK_P1 and AMK_P2 may further include the third open portion OP3 formed based on the arrangement of the first open portion OP1 of the first protective layer PAS1 exposing the upper surface of the pad electrode PE as well as the alignment of the pad electrodes PE and the lead electrodes LE in consideration of the panel alignment marks AMK_P1 and AMK_P2 and the lead alignment marks AMK_L1 and AMK_L2 to perform in consideration of not only the pad electrode PE and the lead electrode LE but also the first open portion OP1. Accordingly, when attaching the printed circuit film COF to the pad area PA, there is an advantage that the alignment margin is reduced.

As shown in FIG. 16, when the above-described attachment method is applied, since the printed circuit film COF is attached to the pad area PA so that the first open portion OP1, the pad electrode PE, and the lead electrode LE completely overlap in the thickness direction, screen driving failures of the display device, which may be caused by an alignment tolerance, may be prevented in advance.

Figure 17:
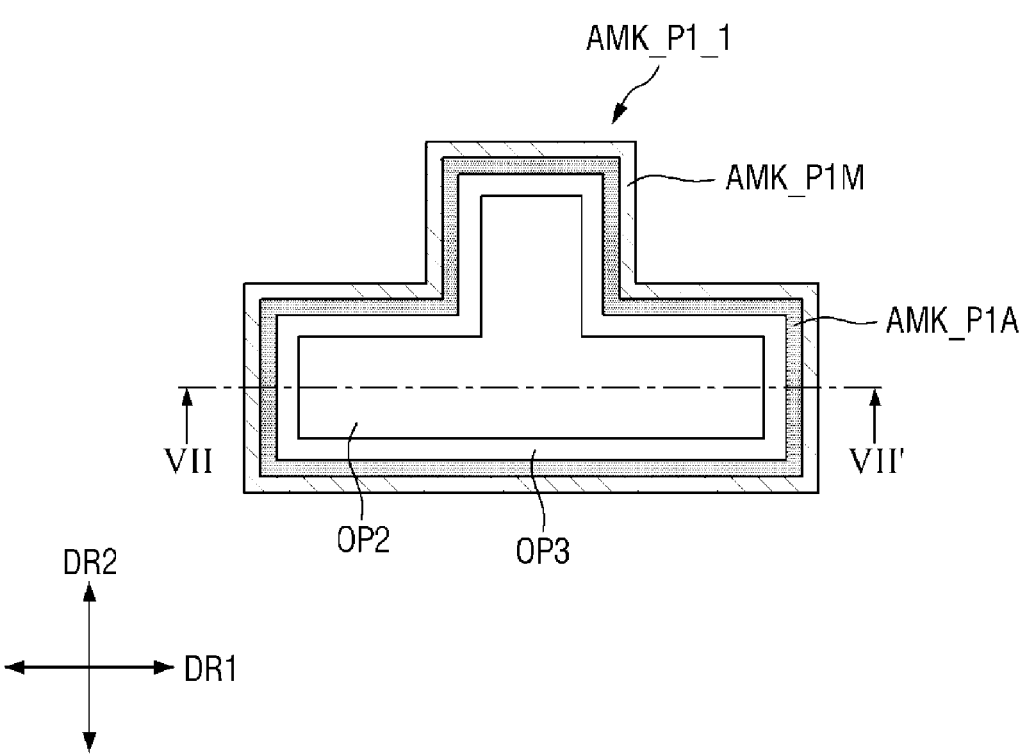
FIG. 17 is a plan view of a first panel alignment mark according to another example embodiment.
Figure 18:
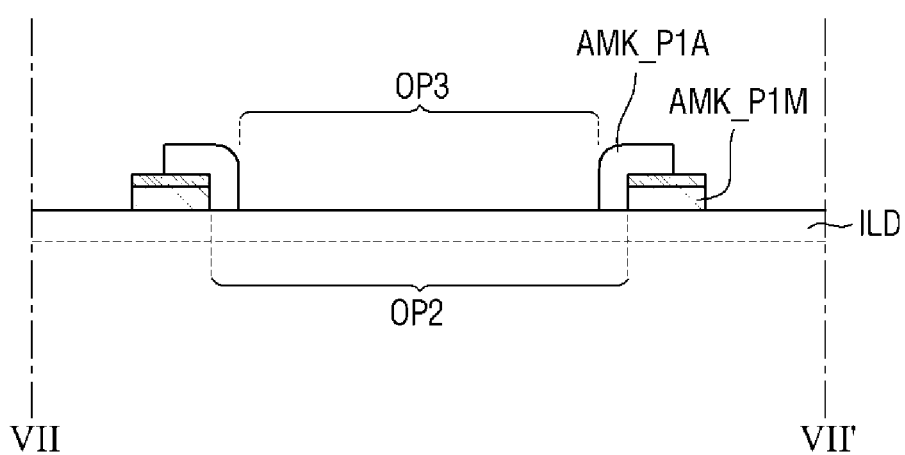
FIG. 18 is a cross-sectional view taken along line VII-VII' of FIG. 17.

FIG. 17 is a plan view of a first panel alignment mark according to another example embodiment. FIG. 18 is a cross-sectional view taken along line VII-VII' of FIG. 17.

Referring to FIGS. 17 and 18, a first panel alignment mark AMK_P1_1 according to the present example embodiment is different from the first panel alignment mark AMK_P1 according to FIGS. 9 and 10 in that the first panel alignment mark AMK_P1_1 further includes a first panel alignment insulating portion AMK_P1A disposed on the first panel alignment metal portion AMK_P1M and positioned on the same layer as the first protective layer PAS1 (in FIG. 10).

The first panel alignment insulating portion AMK_P1A may be physically spaced apart from the first protective layer PAS1.

The first panel alignment mark AMK_P1_1 may include a third open portion OP3 penetrating the first panel alignment insulating portion AMK_P1A in the thickness direction.

The third open portion OP3 may be surrounded by an inner surface of the first panel alignment insulating portion AMK_P1A that is continuously connected and has a closed shape on a plane. The third open portion OP3 may be completely surrounded by the second open portion OP2 on a plane. That is, the diameter of the third open portion OP3 is smaller than that of the second open portion OP2. The first panel alignment insulating portion AMK_P1A may be disposed to overlap the first panel alignment metal portion AMK_P1M in the thickness direction, and a portion in which the first panel alignment insulating portion AMK_P1A and the first panel alignment metal portion AMK_P1M are disposed to overlap in the thickness direction may have a closed shape on a plane. An outer surface of the first panel alignment insulating portion AMK_P1A may be disposed on an upper surface of the first panel alignment metal portion AMK_P1M.

Figure 19:
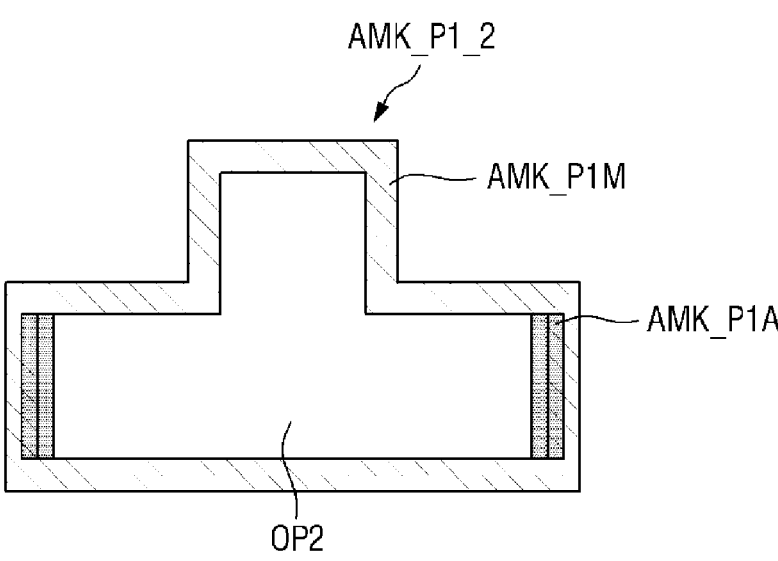
FIG. 19 is a plan view of a first panel alignment mark according to still another example embodiment.
Figure 19:
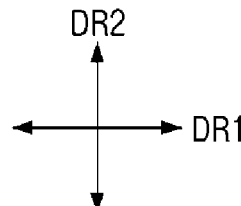

FIG. 19 is a plan view of a first panel alignment mark according to still another example embodiment.

Referring to FIG. 19, a first panel alignment mark AMK_P1_2 according to the present example embodiment is different from the first panel alignment mark AMK_P1_1 according to FIGS. 17 and 18 in that a first panel alignment insulating portion AMK_P1A does not have a closed shape.

That is, a portion in which the first panel alignment insulating portion AMK_P1A and the first panel alignment metal portion AMK_P1M are disposed to overlap in the thickness direction may not have a closed shape on a plane. In FIG. 19, each of two first panel alignment insulating portions AMK_P1A disposed to overlap both lower ends of the first panel alignment metal portion AMK_P1M is illustrated. The two first panel alignment insulating portions AMK_P1A may be physically spaced apart from each other.

Figure 20:
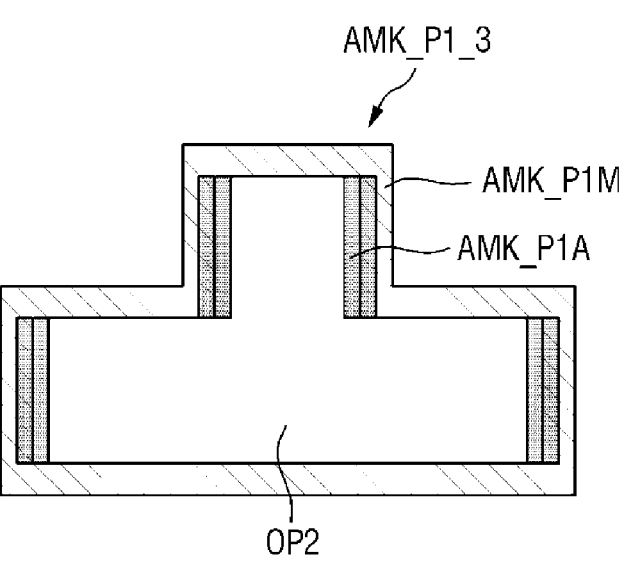
FIG. 20 is a plan view of a first panel alignment mark according to yet another example embodiment.
Figure 20:
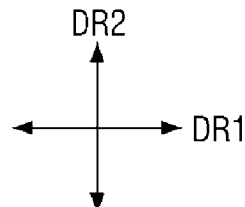

FIG. 20 is a plan view of a first panel alignment mark according to yet another example embodiment.

Referring to FIG. 20, in a first panel alignment mark AMK_P1_3 according to the present example embodiment, two first panel alignment insulating portions AMK_P1A disposed to overlap both upper ends of the first panel alignment metal portion AMK_P1M are further illustrated. Four first panel alignment insulating portions AMK_P1A may be physically spaced apart from each other.

Figure 21:
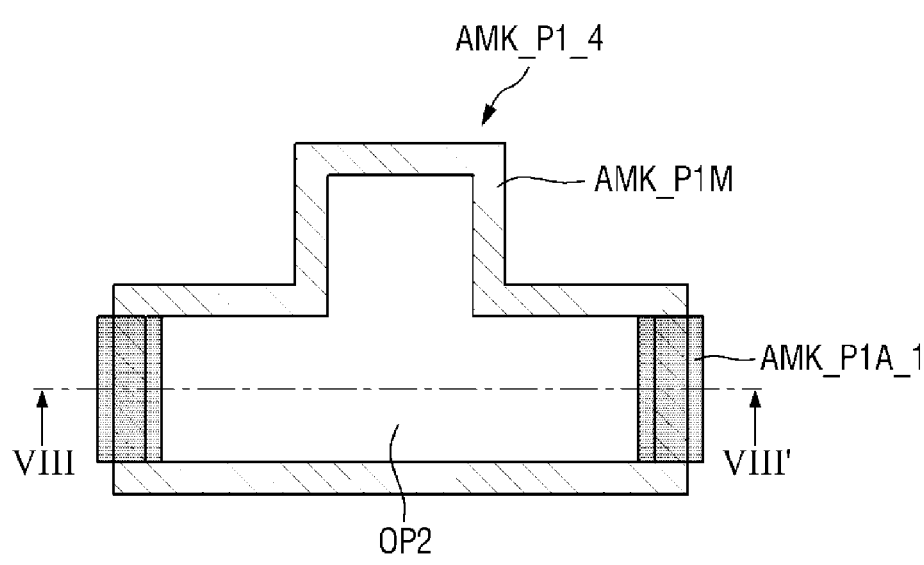
FIG. 21 is a plan view of a first panel alignment mark according to yet another example embodiment.
Figure 21:
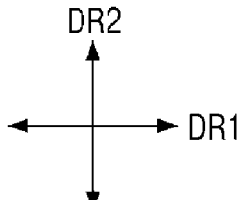
Figure 22:
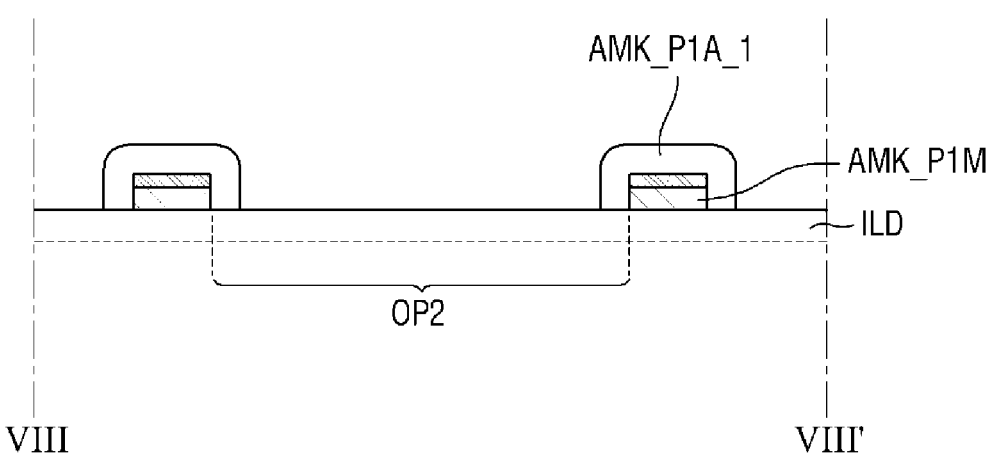
FIG. 22 is a cross-sectional view taken along line VIII-VIII' of FIG. 21.

FIG. 21 is a plan view of a first panel alignment mark according to yet another example embodiment. FIG. 22 is a cross-sectional view taken along line VIII-VIII' of FIG. 21.

Referring to FIGS. 21 and 22, a first panel alignment mark AMK_P1_4 according to the present example embodiment is different from the first panel alignment mark AMK_P1_2 according to FIG. 19 in that a first panel alignment insulating portion AMK_P1A_1 of the first panel alignment mark AMK_P1_4 completely covers the upper surface of the first panel alignment metal portion AMK_P1M, and the first panel alignment insulating portion AMK_P1A_1 is in direct contact with each of the upper surface, the inner surface, and the outer surface of the first panel alignment metal portion AMK_P1M.

Figure 23:
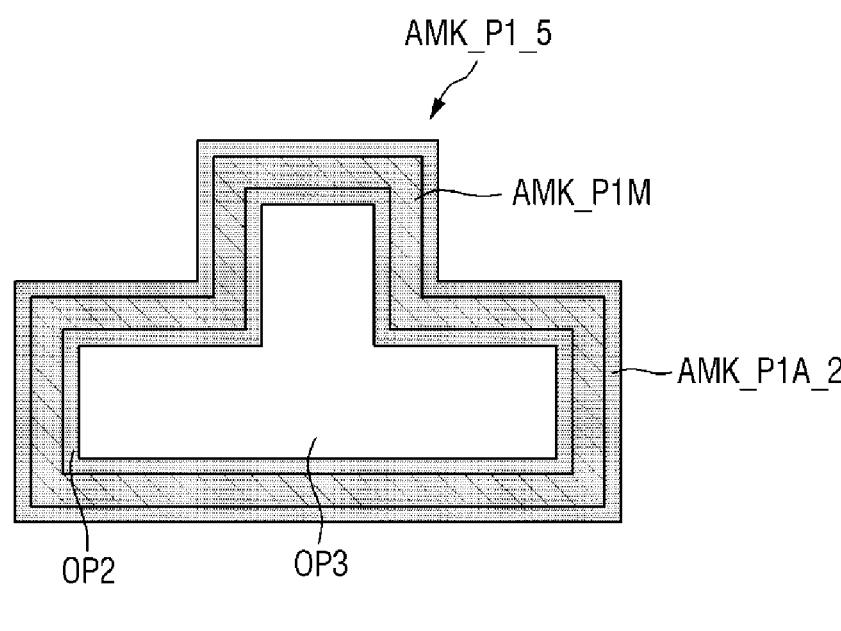
FIG. 23 is a plan view of a first panel alignment mark according to yet another example embodiment.
Figure 23:
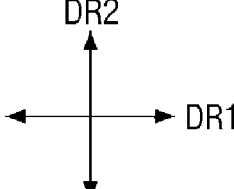

FIG. 23 is a plan view of a first panel alignment mark according to yet another example embodiment.

Referring to FIG. 23, a first panel alignment mark AMK_P1_5 according to the present example embodiment is different from the first panel alignment mark AMK_P1_4 according to FIGS. 21 and 22 in that a third open portion OP3 of the first panel alignment mark AMK_P1_5 is surrounded by an inner surface of a first panel alignment insulating portion AMK_P1A_2 that is continuously connected and has a closed shape on a plane.

The third open portion OP3 may be completely surrounded by the second open portion OP2 on a plane. The first panel alignment insulating portion AMK_P1A_2 may be disposed to overlap the first panel alignment metal portion AMK_P1M in the thickness direction, and a portion in which the first panel alignment insulating portion AMK_P1A_2 and the first panel alignment metal portion AMK_P1M are disposed to overlap in the thickness direction may have a closed shape on a plane.

According to a display device according to the example embodiments, an alignment tolerance between pad electrodes and lead electrodes can be reduced.

Effects according to the example embodiments are not limited by the contents illustrated above, and more various effects are included in the present specification.

What is claimed is:

1. A display device comprising:
a first base portion including a display area having a plurality of pixels connected to corresponding signal lines and a non-display area positioned around the display area and having a pad area; and
a printed circuit film attached to the pad area of the first base portion,
wherein a plurality of pad electrodes arranged on the first base portion in a first direction and a first panel alignment mark positioned on one side of the plurality of pad electrodes in the first direction are disposed in the pad area,
a first protective layer is disposed on the pad electrodes, and a plurality of first open portions each of which exposes a portion of an upper surface of each pad electrode is defined in the first protective layer,
the printed circuit film includes a third base portion and a plurality of lead electrodes disposed on a lower surface of the third base portion and electrically connected to the plurality of pad electrodes, respectively,
the first panel alignment mark includes a first panel alignment metal portion and a second open portion penetrating the first panel alignment metal portion in a thickness direction and surrounded by the first panel alignment metal portion on a plane, and
the first panel alignment metal portion defines a closed loop surrounding the second open portion,
wherein each of the plurality of pad electrodes comprises a first pad portion and a second pad portion disposed on the first pad portion without any insulating layer therebetween, and the first pad portion is physically connected to one of the corresponding signal lines, wherein each of the plurality of lead electrodes in the printed circuit film is electrically connected to the second pad portion,
wherein the second pad portion includes a first surface facing an upper surface of the first pad portion and a second surface opposite to the first surface, and an entirety of the first surface of the second pad portion is in direct contact with an entirety of the upper surface of the first pad portion, and
wherein the second surface of the second pad portion is in direct contact with a conductive material through which the lead electrode is electrically connected to the second pad portion.

2. The display device of claim 1, wherein the first panel alignment mark and the pad electrode are positioned on a same layer.

3. The display device of claim 2, wherein the first protective layer is disposed on the first panel alignment metal portion,
a third open portion completely penetrating the first protective layer in the thickness direction is defined in the first panel alignment mark, and
the third open portion is surrounded by an inner surface of the first protective layer on a plane.

4. The display device of claim 3, wherein the third open portion is completely surrounded by the second open portion on a plane.

5. The display device of claim 4, further comprising a second panel alignment mark positioned on an other side of the plurality of pad electrodes in the first direction.

6. The display device of claim 5, wherein the second panel alignment mark has a same structure as the first panel alignment mark,
the second panel alignment mark includes a second panel alignment metal portion, and a second open portion penetrating the second panel alignment metal portion in the thickness direction and surrounded by the second panel alignment metal portion on a plane, is defined in the second panel alignment mark,
the first protective layer is further disposed on the second panel alignment mark,
a third open portion completely penetrating the first protective layer in the thickness direction is defined in the second panel alignment mark, and
the third open portion is surrounded by the inner surface of the first protective layer.

7. The display device of claim 6, wherein the printed circuit film further includes a first lead alignment mark positioned on one side of the plurality of lead electrodes in the first direction on the lower surface of the third base portion and a second lead alignment mark positioned on an other side of the plurality of lead electrodes in the first direction.

8. The display device of claim 7, wherein each of the first panel alignment metal portion of the first panel alignment mark and the second panel alignment metal portion of the second panel alignment mark is disposed based on the arrangement of the plurality of pad electrodes, and
each of the third open portion of the first panel alignment mark and the third open portion of the second panel alignment mark is disposed based on the arrangement of the first open portions exposing a part of the upper surface of each of the plurality of pad electrodes.

9. The display device of claim 8, wherein each of the first lead alignment mark and the second lead alignment mark is disposed based on the arrangement of the plurality of lead electrodes.

10. The display device of claim 9, wherein the first panel alignment mark has a symmetrical shape in the first direction.

11. The display device of claim 9, wherein when the printed circuit film is attached to the pad area, based on the first direction, a first equal division point between the first panel alignment metal portion of the first panel alignment mark and the second panel alignment metal portion of the second panel alignment mark, a second equal division point between the third open portion of the first panel alignment mark and the third open portion of the second panel alignment mark, and a third equal division point between the first lead alignment mark and the second lead alignment mark are considered.

12. The display device of claim 11, wherein the printed circuit film is attached to the pad area so that an overlapping line connecting the first equal division point and the second equal division point and extending along a second direction crossing the first direction and the third equal division point meet.

13. The display device of claim 1, further comprising an anisotropic conductive film disposed between the pad electrode and the lead electrode and including an insulating resin and conductive balls dispersed in the insulating resin,
wherein the pad electrode and the lead electrode are electrically connected through the conductive balls.

14. The display device of claim 1, wherein the plurality of pad electrodes connected to the corresponding signal lines extends from the pad area toward the display area.

15. An electronic apparatus comprising:
a first base portion including a display area including a plurality of pixels connected to corresponding signal lines and a non-display area positioned around the display area and having a pad area; and
a printed circuit film attached to the pad area of the first base portion,
wherein a plurality of pad electrodes arranged on the first base portion in a first direction and a first panel alignment mark positioned on one side of the plurality of pad electrodes in the first direction are disposed in the pad area,
a first protective layer is disposed on the pad electrodes, a plurality of first open portions each of which exposes a portion of an upper surface of each pad electrode is defined in the first protective layer,
the printed circuit film includes a third base portion and a plurality of lead electrodes disposed on a lower surface of the third base portion and electrically connected to the plurality of pad electrodes, respectively,
the first panel alignment mark includes a first panel alignment metal portion, and a first panel alignment insulating portion disposed on the first panel alignment metal portion and positioned on a same layer as the first protective layer, and a second open portion penetrating the first panel alignment metal portion in a thickness direction and surrounded by the first panel alignment metal portion on a plane,
the first panel alignment mark and the pad electrode are positioned on a same layer,
the first panel alignment insulating portion is spaced apart from the first protective layer, and
the first panel alignment metal portion defines a closed loop surrounding the second open portion,
wherein each of the plurality of pad electrodes comprises a first pad portion and a second pad portion disposed on the first pad portion without any insulating layer therebetween, and the first pad portion is physically connected to one of the corresponding signal lines,
wherein each of the plurality of lead electrodes in the printed circuit film is electrically connected to the second pad portion,
wherein the second pad portion includes a first surface facing an upper surface of the first pad portion and a second surface opposite to the first surface, and an entirety of the first surface of the second pad portion is in direct contact with an entirety of the upper surface of the first pad portion, and
wherein the second surface of the second pad portion is in direct contact with a conductive material through which the lead electrode is electrically connected to the second pad portion.

16. The electronic apparatus of claim 15, wherein an outer surface of the first panel alignment insulating portion is disposed on an upper surface of the first panel alignment metal portion.

17. The electronic apparatus of claim 15, wherein the first panel alignment insulating portion is in direct contact with an inner surface, an upper surface, and an outer surface of the first panel alignment metal portion.

18. The electronic apparatus of claim 15, wherein a third open portion penetrating the first panel alignment insulating portion in the thickness direction is defined in the first panel alignment mark, and
the third open portion is surrounded by an inner surface of the first panel alignment insulating portion on a plane.

19. The electronic apparatus of claim 15, further comprising
an anisotropic conductive film disposed between the pad electrode and the lead electrode and including an insulating resin and conductive balls dispersed in the insulating resin,
wherein the pad electrode and the lead electrode are electrically connected through the conductive balls.

20. The electronic apparatus of claim 15, wherein the plurality of pad electrodes connected to the corresponding signal lines extends from the pad area toward the display area.

* * * * *